(12) United States Patent
Iizuka et al.

(10) Patent No.: US 11,115,614 B2
(45) Date of Patent: Sep. 7, 2021

(54) IMAGE SENSOR WITH A/D CONVERSION CIRCUIT HAVING REDUCED DNL DETERIORATION

(71) Applicant: RENESAS ELECTRONICS CORPORATION, Tokyo (JP)

(72) Inventors: Yoichi Iizuka, Tokyo (JP); Fukashi Morishita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 36 days.

(21) Appl. No.: 16/668,803

(22) Filed: Oct. 30, 2019

(65) Prior Publication Data

US 2020/0195871 A1   Jun. 18, 2020

(30) Foreign Application Priority Data

Dec. 13, 2018   (JP) .............................. JP2018-233834

(51) Int. Cl.
*H04N 5/378* (2011.01)
*H03M 1/34* (2006.01)
*H03M 1/56* (2006.01)
*H03K 23/54* (2006.01)

(52) U.S. Cl.
CPC .......... *H04N 5/378* (2013.01); *H03K 23/542* (2013.01); *H03M 1/34* (2013.01); *H03M 1/56* (2013.01)

(58) Field of Classification Search
CPC ......................... H04N 5/378; H03M 1/34–468
See application file for complete search history.

(56) References Cited

U.S. PATENT DOCUMENTS

| | | | |
|---|---|---|---|
| 8,941,045 B2 | 1/2015 | Okura et al. | |
| 2015/0189214 A1* | 7/2015 | Kurose | H01L 25/18 250/208.1 |
| 2019/0067359 A1* | 2/2019 | Matsumoto | H01L 27/14621 |
| 2020/0275045 A1* | 8/2020 | Higashi | H04N 5/378 |
| 2020/0396405 A1* | 12/2020 | Kim | H04N 5/3698 |

FOREIGN PATENT DOCUMENTS

| | | |
|---|---|---|
| JP | 2008-092091 A | 4/2008 |
| JP | 2013-229708 A | 11/2013 |

* cited by examiner

*Primary Examiner* — Paul M Berardesca
(74) *Attorney, Agent, or Firm* — McDermott Will & Emery LLP

(57) ABSTRACT

The present invention provides a semiconductor device having an integration type A/D converter capable of speeding up. The semiconductor device includes a Johnson counter 18 for transmitting a lower bit counter signal JC<3:0>, a lower bit latch circuit 11 for outputting a lower bit latch result signal by a lower bit counter signal JC<3:0> and a lower bit latch signal 14, a determination circuit 12 for outputting an upper bit latch signal 15 by a lower bit latch signal 14, a binary gray converter circuit 20 for transmitting an upper bit counter signal GR<n:3>, and an upper bit latch circuit 13 for outputting an upper bit latch result signal by an upper bit counter signal GR<n:3> and an upper bit latch signal 15.

11 Claims, 23 Drawing Sheets

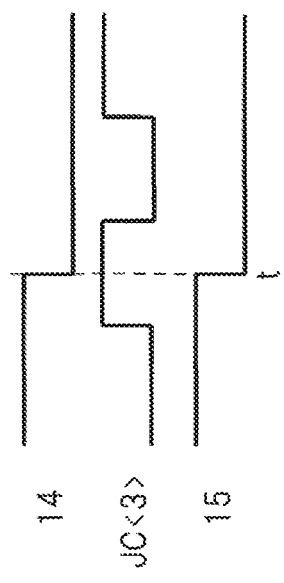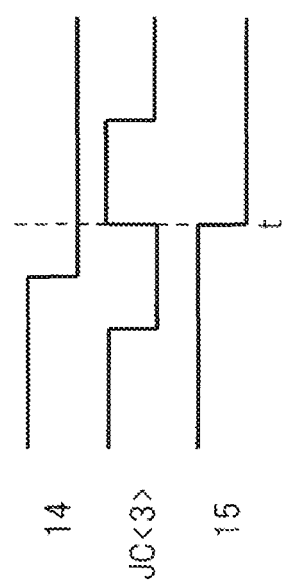

FIG. 7

| COUNTER VLAUE | GR<5> | GR<4> | GR<3> | JC<3> | JC<2> | JC<1> | JC<0> |
|---|---|---|---|---|---|---|---|
| 0 | 0 | 0 | 0 | 0 | 0 | 0 | 0 |
| 1 | 0 | 0 | 0 | 0 | 0 | 0 | 1 |
| 2 | 0 | 0 | 0 | 0 | 0 | 1 | 1 |
| 3 | 0 | 0 | 0 | 0 | 1 | 1 | 1 |
| 4 | 0 | 0 | 0 | 1 | 1 | 1 | 1 |
| 5 | 0 | 0 | 1 | 1 | 1 | 1 | 0 |
| 6 | 0 | 0 | 1 | 1 | 1 | 0 | 0 |
| 7 | 0 | 0 | 1 | 1 | 0 | 0 | 0 |
| 8 | 0 | 0 | 1 | 0 | 0 | 0 | 0 |
| 9 | 0 | 0 | 1 | 0 | 0 | 0 | 1 |
| 10 | 0 | 0 | 1 | 0 | 0 | 1 | 1 |
| 11 | 0 | 0 | 1 | 0 | 1 | 1 | 1 |
| 12 | 0 | 0 | 1 | 1 | 1 | 1 | 1 |
| 13 | 0 | 0 | 1 | 1 | 1 | 1 | 0 |
| 14 | 0 | 0 | 1 | 1 | 1 | 0 | 0 |
| 15 | 0 | 0 | 1 | 1 | 0 | 0 | 0 |
| 16 | 0 | 1 | 1 | 0 | 0 | 0 | 0 |
| 17 | 0 | 1 | 1 | 0 | 0 | 0 | 1 |
| 18 | 0 | 1 | 1 | 0 | 0 | 1 | 1 |
| 19 | 0 | 1 | 1 | 0 | 1 | 1 | 1 |
| 20 | 0 | 1 | 1 | 1 | 1 | 1 | 1 |
| 21 | 0 | 1 | 0 | 1 | 1 | 1 | 0 |
| 22 | 0 | 1 | 0 | 1 | 1 | 0 | 0 |
| 23 | 0 | 1 | 0 | 1 | 0 | 0 | 0 |
| 24 | 0 | 1 | 0 | 0 | 0 | 0 | 0 |
| 25 | 0 | 1 | 0 | 0 | 0 | 0 | 1 |
| 26 | 0 | 1 | 0 | 0 | 0 | 1 | 1 |
| 27 | 0 | 1 | 0 | 0 | 1 | 1 | 1 |
| 28 | 0 | 1 | 0 | 1 | 1 | 1 | 1 |
| 29 | 0 | 1 | 0 | 1 | 1 | 1 | 0 |
| 30 | 0 | 1 | 0 | 1 | 1 | 0 | 0 |
| 31 | 0 | 1 | 0 | 1 | 0 | 0 | 0 |
| 32 | 1 | 1 | 0 | 0 | 0 | 0 | 0 |

FIG. 19

| COUNTER VLAUE | GR<5> | GR<4> | GR<3> | GR<2> | JC<2> | JC<1> | JC<0> |
|---|---|---|---|---|---|---|---|
| 0 | 0 | 0 | 0 | 0 | 0 | 0 | 0 |
| 1 | 0 | 0 | 0 | 0 | 0 | 0 | 1 |
| 2 | 0 | 0 | 0 | 0 | 0 | 1 | 1 |
| 3 | 0 | 0 | 0 | 0 | 1 | 1 | 1 |
| 4 | 0 | 0 | 0 | 1 | 1 | 1 | 0 |
| 5 | 0 | 0 | 0 | 1 | 1 | 0 | 0 |
| 6 | 0 | 0 | 0 | 1 | 0 | 0 | 0 |
| 7 | 0 | 0 | 0 | 1 | 0 | 0 | 1 |
| 8 | 0 | 0 | 1 | 0 | 0 | 1 | 1 |
| 9 | 0 | 0 | 1 | 0 | 1 | 1 | 1 |
| 10 | 0 | 0 | 1 | 0 | 1 | 1 | 0 |
| 11 | 0 | 0 | 1 | 0 | 1 | 0 | 0 |
| 12 | 0 | 0 | 1 | 1 | 0 | 0 | 0 |
| 13 | 0 | 0 | 1 | 1 | 0 | 0 | 1 |
| 14 | 0 | 0 | 1 | 1 | 0 | 1 | 1 |
| 15 | 0 | 1 | 1 | 1 | 1 | 1 | 1 |
| 16 | 0 | 1 | 1 | 1 | 1 | 1 | 0 |
| 17 | 0 | 1 | 1 | 1 | 1 | 0 | 0 |
| 18 | 0 | 1 | 1 | 1 | 0 | 0 | 0 |
| 19 | 0 | 1 | 1 | 0 | 0 | 0 | 1 |
| 20 | 0 | 1 | 1 | 0 | 0 | 1 | 1 |
| 21 | 0 | 1 | 1 | 0 | 1 | 1 | 1 |
| 22 | 0 | 1 | 0 | 0 | 1 | 1 | 0 |
| 23 | 0 | 1 | 0 | 0 | 1 | 0 | 0 |
| 24 | 0 | 1 | 0 | 1 | 0 | 0 | 0 |
| 25 | 0 | 1 | 0 | 1 | 0 | 0 | 1 |
| 26 | 0 | 1 | 0 | 1 | 0 | 1 | 1 |
| 27 | 0 | 1 | 0 | 1 | 1 | 1 | 1 |
| 28 | 0 | 1 | 0 | 1 | 1 | 1 | 0 |
| 29 | 0 | 1 | 0 | 0 | 1 | 0 | 0 |
| 30 | 0 | 1 | 0 | 0 | 0 | 0 | 0 |
| 31 | 0 | 1 | 0 | 0 | 0 | 0 | 0 |
| 32 | 1 | 1 | 0 | 0 | 0 | 0 | 0 |

FIG. 23

| COUNTER VALUE | GR<5> | GR<4> | GR<3> | GR<2> | GR<1> | GR<0> |
|---|---|---|---|---|---|---|
| 0 | 0 | 0 | 0 | 0 | 0 | 0 |
| 1 | 0 | 0 | 0 | 0 | 0 | 1 |
| 2 | 0 | 0 | 0 | 0 | 1 | 1 |
| 3 | 0 | 0 | 0 | 0 | 1 | 0 |
| 4 | 0 | 0 | 0 | 1 | 1 | 0 |
| 5 | 0 | 0 | 0 | 1 | 1 | 1 |
| 6 | 0 | 0 | 0 | 1 | 0 | 1 |
| 7 | 0 | 0 | 0 | 1 | 0 | 0 |
| 8 | 0 | 0 | 1 | 1 | 0 | 0 |
| 9 | 0 | 0 | 1 | 1 | 0 | 1 |
| 10 | 0 | 0 | 1 | 1 | 1 | 1 |
| 11 | 0 | 0 | 1 | 1 | 1 | 0 |
| 12 | 0 | 0 | 1 | 0 | 1 | 0 |
| 13 | 0 | 0 | 1 | 0 | 1 | 1 |
| 14 | 0 | 0 | 1 | 0 | 0 | 1 |
| 15 | 0 | 0 | 1 | 0 | 0 | 0 |
| 16 | 0 | 1 | 1 | 0 | 0 | 0 |
| 17 | 0 | 1 | 1 | 0 | 0 | 1 |
| 18 | 0 | 1 | 1 | 0 | 1 | 1 |
| 19 | 0 | 1 | 1 | 0 | 1 | 0 |
| 20 | 0 | 1 | 1 | 1 | 1 | 0 |
| 21 | 0 | 1 | 1 | 1 | 1 | 1 |
| 22 | 0 | 1 | 1 | 1 | 0 | 1 |
| 23 | 0 | 1 | 1 | 1 | 0 | 0 |
| 24 | 0 | 1 | 0 | 1 | 0 | 0 |
| 25 | 0 | 1 | 0 | 1 | 0 | 1 |
| 26 | 0 | 1 | 0 | 1 | 1 | 1 |
| 27 | 0 | 1 | 0 | 1 | 1 | 0 |
| 28 | 0 | 1 | 0 | 0 | 1 | 0 |
| 29 | 0 | 1 | 0 | 0 | 1 | 1 |
| 30 | 0 | 1 | 0 | 0 | 0 | 1 |
| 31 | 0 | 1 | 0 | 0 | 0 | 0 |
| 32 | 1 | 1 | 0 | 0 | 0 | 0 |

IMAGE SENSOR WITH A/D CONVERSION CIRCUIT HAVING REDUCED DNL DETERIORATION

CROSS-REFERENCE TO RELATED APPLICATIONS

The disclosure of Japanese Patent Application No. 2018-233834 filed on Dec. 13, 2018 including the specification, drawings and abstract is incorporated herein by reference in its entirety.

BACKGROUND

The present invention relates to a semiconductor device and system, for example, a system including an semiconductor device with integrated analog-to-digital (A/D) converter circuits and an image sensor.

THE BACKGROUND OF THE INVENTION

The image sensor includes a pixel portion in which a plurality of photosensitive elements are arranged in a matrix, and an A/D conversion circuit for converting an analog signal from the photosensitive elements into a digital signal. In recent years, higher frame rates, higher image quality, and more pixels are increasingly required for image sensors. In order to meet this demand, the A/D conversion circuit is also required to have a high speed.

For example, Patent Documents 1 and 2 disclose a technique using an integration type A/D conversion circuit using a counter circuit for counting a time until the value of an analog signal reaches a reference value as an A/D conversion circuit used in an image sensor.

PRIOR-ART DOCUMENT

Patent Document

[Patent Document 1]
JP-A-2008-92091
[Patent Document 2]
JP-A-2013-229708

SUMMARY

As a result of examination by the present inventors, it has been found that, in the integration type A/D converter circuits described in Patent Documents 1 and 2, deterioration of DNL (Differential Non-Linearity) and malfunction may occur when the speed is increased. The present inventors' study will be described below. Here, a study based on the integration type A/D conversion circuit described in Patent Document 2 will be described.

FIG. 17 is a block diagram showing a configuration of an integration type A/D conversion circuit of a comparative example configured by the present inventors based on an integration type A/D conversion circuit described in Patent Document 2. The image sensor 170 includes a pixel portion (not shown), a control circuit 171, a plurality of integration type A/D conversion circuit 177, and a reference voltage generation circuit 181.

In the pixel portion, a plurality of photosensitive elements are arranged in a matrix, and the integration type A/D conversion circuit 177 is arranged so as to correspond to each column of the pixel portion. An analog signal from a photosensitive element disposed in the pixel portion is supplied as an input signal to a corresponding integration type A/D conversion circuit 177, is converted into a digital signal by the integration type A/D conversion circuit 177, and the digital signal is outputted as a result output. Since the integration type A/D conversion circuit 177 corresponds to each column of the pixel portion, it may also be referred to as a column integration type A/D conversion circuit.

The integration type A/D conversion circuit 177 includes a comparison circuit 178 and a latch circuit 179. The comparison circuit 178 compares the input signal with the reference voltage generated by the reference voltage generation circuit 181. The reference voltage is, for example, a ramp wave, and the voltage value changes linearly with the passage of time. When the voltage of the input signal exceeds, for example, the reference voltage, the latch signal 184, which is the output of the comparison circuit 178, is inverted. By inverting the latch signal 184, the latch circuit 179 latches the lower bit counter signal JC<2:0> and the upper bit counter signal GR<n:2> output to the counter signal lines 182<2:0>, 183<n:2>.

Here, the notation method used in this specification will be described. number sandwiched between the above-mentioned symbols< > and partitioned by symbol: indicate bit number, and symbol: indicates all of the partitioned bit number. For example, the lower bit counter signals JC<2:0> indicate that are configured by the lower bit counter signals JC<0> to JC<2>. Similarly, the upper bit counter signals GR<n:2> indicate that are configured by the upper bit counter signals GR<2> to GR<n>. In addition, the counter signal line 182<2:0> indicates that is configured by the counter signal lines 182<0> to 182<2> which transmit the lower bit counter signals JC<0> to JC<2>. Similarly, the counter signal lines 183<n:2> indicates that is configured by the counter signal lines 183<2> to 183<n> which transmit the upper bit counter signals GR<2> to GR<n>.

When the latch signal 184 is inverted, the latch circuit 179 latches the lower bit counter signals JC<0> to JC<2> and the upper bit counter signals GR<2> to GR<n> at that time.

The control circuit 171 includes a Johnson counter 172, a binary counter 173, a binary gray conversion circuit 174 for converting a binary code into a gray code, a delay adjustment circuit 175, and a synchronization circuit 176.

A predetermined clock signal CLK is supplied to the Johnson counter 172. The Johnson counter 172 generates a lower bit counter signal that changes with a phase difference from each other based on the supplied clock signal CLK. A part of the lower bit counter signal generated by the Johnson counter 172 is supplied to the binary counter 173. The binary counter 173 counts the supplied lower bit counter signal and generates the counter signal BC<n:2> of a binary code. The binary gray conversion circuit 174 converts the counter signal BC<n:2> into an upper bit counter signal of a gray code and outputs the counter signal BC. That is, the binary gray conversion circuit 174 generates a upper bit counter signal of a gray code in which only one logical value changes at a time, based on the counter signal BC<n:2> of the binary code.

The delay of the lower bit counter signal generated by the Johnson counter 172 is adjusted by the delay adjustment circuit 175 so as to delay the lower bit counter signal generated by the Johnson counter 172 by the delay caused by the binary counter 173 and the binary gray conversion circuit 174. The lower bit counter signal whose delay is adjusted and the upper bit counter signal generated by the binary gray conversion circuit 174 are supplied to the synchronization circuit 176. Synchronization circuit 176 adjusts the lower bit counter signal to synchronize with the upper bit counter signal, and the lower bit counter signal is supplied from synchronizing circuit 176 to counter signal line 182<2:0> as the lower bit counter signal JC<2:0>. The upper bit counter signal is supplied from the synchronization circuit 176 to the counter signal line 183<n:2> as the upper bit counter signal GR<n:2>.

The Johnson counter 172 starts counting the clock signal CLK, for example, when the reference voltage starts changing. Thus, the latch circuit 179 in each integrated A/D conversion circuit 177 latches the upper bit counter signal GR<n:2> and the lower bit counter signal JC<2:0>, and the digital signal corresponding to the input signal that is the analog signal is output as a result.

FIG. 18 is a timing diagram showing an example of the times of the lower bit counter signals JC<0> to JC<2> and the upper bit counter signals GR<2> to GR<n>. FIG. 18 shows the timing in the case of an ideal bit counter signal. FIG. 19 shows an example of a conversion table showing a counter signal of lower bit counter signals JC<0> to JC<2> and upper bit counter signals GR<2> to GR<5>, a bit code represented by the counter signal, and a counter value represented by the bit code. In FIG. 18, when the bit counter signal is at the high level, the logical value of the bit counter signal corresponds to "1" shown in FIG. 19, and when the bit counter signal is at the low level, the logical value of the bit counter signal corresponds to "0" shown in FIG. 19.

For example, if the latch signal 184 is inverted when the lower bit counter signals JC<0> to JC<2> are at the high level (logical value "1") and the upper bit counter signals GR<2> to GR<5> are at the low level (logical value "0"), the latch circuit 179 latching the lower bit counter signals JC<2:0> will latch the logical value "1". At this time, the logical value "0" is latched in the latch circuit 179 that latches the upper bit counter signals GR<5:2>. As a result, the input signal is converted into a counter value "3" as shown in FIG. 19, and is output as a result output.

The number of columns of the pixel portion are, for example, several thousands to several tens of thousands. Therefore, a repeater 180 is coupled to the counter signal lines 182<2:0>, 183<n:2>. The bit counter signal propagating through the counter signal lines 182 and 183 propagates through the counter signal line while waveform shaping is performed by the repeater 180. The number of counter signal lines 182 and 183 correspond to the number of bits of the digital signal after A/D conversion, and are, for example, several tens.

FIG. 20 is a diagram showing an A/D conversion operation when an ideal A/D conversion is performed in the comparative example. In FIG. 20, on the left side of the arrow, ideal times of the lower bit counter signals JC<0> to JC<2> and the upper bit counter signals GR<2> to GR<3> are shown. In FIG. 20, on the right side of the arrow, the relationship between the analog input to the A/D conversion circuit 177 and the digital output from the A/D conversion circuit 177 is shown.

In FIG. 20, 1LSB indicates a period corresponding to the minimum input voltage (minimum input voltage change amount) that can be digitally converted by the A/D converter 177. As shown in FIG. 20, ideally, the lower bit counter signal JC and the upper bit counter signal GR change in units of time 1LSB, and no skew occurs. As a result, as shown in FIG. 20, the A/D conversion circuit 177 outputs a digital output that linearly changes in proportion to a change in the analog input. That is, the A/D conversion circuit 177 converts the analog input into a digital output at equal intervals, and no degradation of the DNL occurs.

FIG. 21 is a diagram showing an A/D conversion operation when DNL deterioration occurs in the comparative example. In FIG. 21, the timing of the lower bit counter signal JC and the upper bit counter signal GR is shown on the left side of the arrow in the same manner as in FIG. 20. FIG. 21 shows a case where the change of the upper bit counter signal GR<2> is delayed and skew occurs. In this instance, as shown on the right side of the arrow in FIG. 21, the period corresponding to the counter value "3" becomes longer than the time 1LSB, and on the contrary, the period corresponding to the counter value "4" becomes shorter than the time 1LSB. That is, the A/D conversion circuit 177 converts an analog input into a digital signal at unequal intervals, and the DNL is deteriorated.

FIG. 22 shows the A/D converting operation when the delay due to the skew is larger than that shown in FIG. 21 and longer than the time 1LSB in the comparative embodiment. In FIG. 22, as shown on the left side of the arrow, the upper bit counter signal GR<2> changes over time longer than the time 1LSB as compared with the ideal case shown in FIG. 20. In this instance, as shown on the right side of the arrow in FIG. 22, the period in which the digital output indicates the counter value "3" is longer than the time 1LSB, and the period in which the digital output should indicate the counter value "4" is extended. In other words, during a period in which the digital output should indicate the counter value "4", an impossible code (indefinite code) is output from the A/D conversion circuit 177, and an error occurs in the A/D conversion operation, resulting in a large error or malfunction.

That is, if there is a delay difference between the lower bit counter signal JC and the upper bit counter signal GR, the A/D conversion circuit 177 outputs an indefinite code or leads to deterioration of DNL. In this case, distortion, horizontal streaks, or image disturbance (spots) such as a white point or a black point occurs in the image data acquired by the image sensor. That is, the skew of the counter signal used in the A/D conversion circuit greatly affects the A/D conversion characteristic and the quality of the image.

As shown in FIG. 17, the lower bit counter signal JC and the upper bit counter signal GR generated by the control circuit 171 are distributed to many A/D conversion circuits 177 arranged in each column by counter signal lines 182 and 183. That is, the counter signal lines 182 and 183 are arranged so as to extend so as to transmit the counter signal to each of a number of A/D conversion circuits 177 arranged over thousands to tens of thousands of columns. The number of counter signals is determined by the resolution of the A/D conversion circuit 177. Under such conditions, in order to prevent deterioration of the image quality, it is necessary to adjust the skew between the lower bit counter signal JC and the upper bit counter signal GR in the A/D conversion circuit 177 arranged in each column.

In the comparative example shown in FIG. 17, the timing of the lower bit counter signal JC<2:0> and the upper bit counter signal GR<n:2> is adjusted with high accuracy by the delay adjustment circuit 175 and the synchronization circuit 176, and the delays of the lower bit counter signal JC<2:0> and the upper bit counter signal GR<n:2> are also required to be adjusted with high accuracy even in the A/D conversion circuit arranged in a number of thousands to tens of thousands of columns. Therefore, in the comparative example, the area is increased by the delay adjustment circuit 175 and the synchronization circuit 176, and high-precision adjustment of the delay of the counter signal in the A/D conversion circuit portion arranged in the column is also required.

Further, since the frame rate and image quality of the image sensor have been increased and the speed of the A/D conversion circuit has been increased, the allowable skew request error has been reduced, and the number of columns of the pixel portion has been increased due to the increase in the number of pixels, and the number of counter signal lines has been increased due to the increase in the resolution of the A/D conversion circuit, thereby making skew adjustment difficult and making it difficult to satisfy the skew request error.

Although the problem has been described using a comparative example based on Patent Document 2, even in the A/D conversion circuit described in Patent Document 1, if there is a skew between counter signals, DNL deterioration or malfunction occurs, and the quality of an image deteriorates.

Other objects and novel features will become apparent from the description of this specification and the accompanying drawings.

Means of Solving the Problems

The semiconductor device according to one embodiment is as follows.

That is, the semiconductor device includes a lower counter circuit for outputting a lower bit counter signal, a lower bit latch circuit for outputting a lower bit latch result signal by a lower bit counter signal and a lower bit latch signal, a lower bit decision circuit for outputting an upper bit latch signal by a lower bit latch signal, an upper counter circuit for outputting an upper bit counter signal, and an upper bit latch circuit for outputting an upper bit latch result signal by an upper bit counter signal and an upper bit latch signal.

The semiconductor device according to another embodiment is as follows.

That is, the semiconductor device includes: a comparison voltage generating circuit for generating a reference voltage that linearly changes with the passage of time; a counter circuit that outputs an upper bit counter signal and a lower bit counter signal, each of which has a value that changes with the passage of time and includes a plurality of bit counter signals, a comparator circuit that compares an input signal and a reference voltage and outputs a lower bit latch signal when the input signal and the reference voltage reach a predetermined relationship; a lower bit latch circuit that latches a lower bit counter signal in response to the lower bit latch signal; a decision circuit that outputs an upper bit latch signal in a period excluding an indefinite period in which the upper bit counter signal becomes indefinite based on the lower bit latch signal and the predetermined bit counter signal in the lower bit counter signal; and an upper bit latch circuit that latches an upper bit counter signal in response to the upper bit latch signal and an integration type A/D conversion circuit that outputs an upper bit counter signal latched by the upper bit latch circuit and a lower bit counter signal latched by the lower bit latch circuit as a digital signal corresponding to an input signal.

Effect of the Invention

According to one embodiment, it is possible to provide a semiconductor device including an integration type A/D converter capable of speeding up.

BRIEF DESCRIPTION OF THE DRAWINGS

FIGS. 5 (A) and (B) are timing diagrams for explaining the operation of the determination circuits related to first embodiment.

FIG. 7 is a conversion table showing the correspondence of a counter signal output from a counter circuit, a bit code and a counter value related to first embodiment.

FIG. 19 is a diagram of a conversion table showing the correspondence of the lower bit counter signal, the upper bit counter signal, the bit code and the counter value represented by the bit code.

FIG. 23 is a diagram of a conversion table showing the correspondence of the bit code represented by the gray code counter signal and the counter value represented by the bit code.

DETAILED DESCRIPTION

Figure 1:
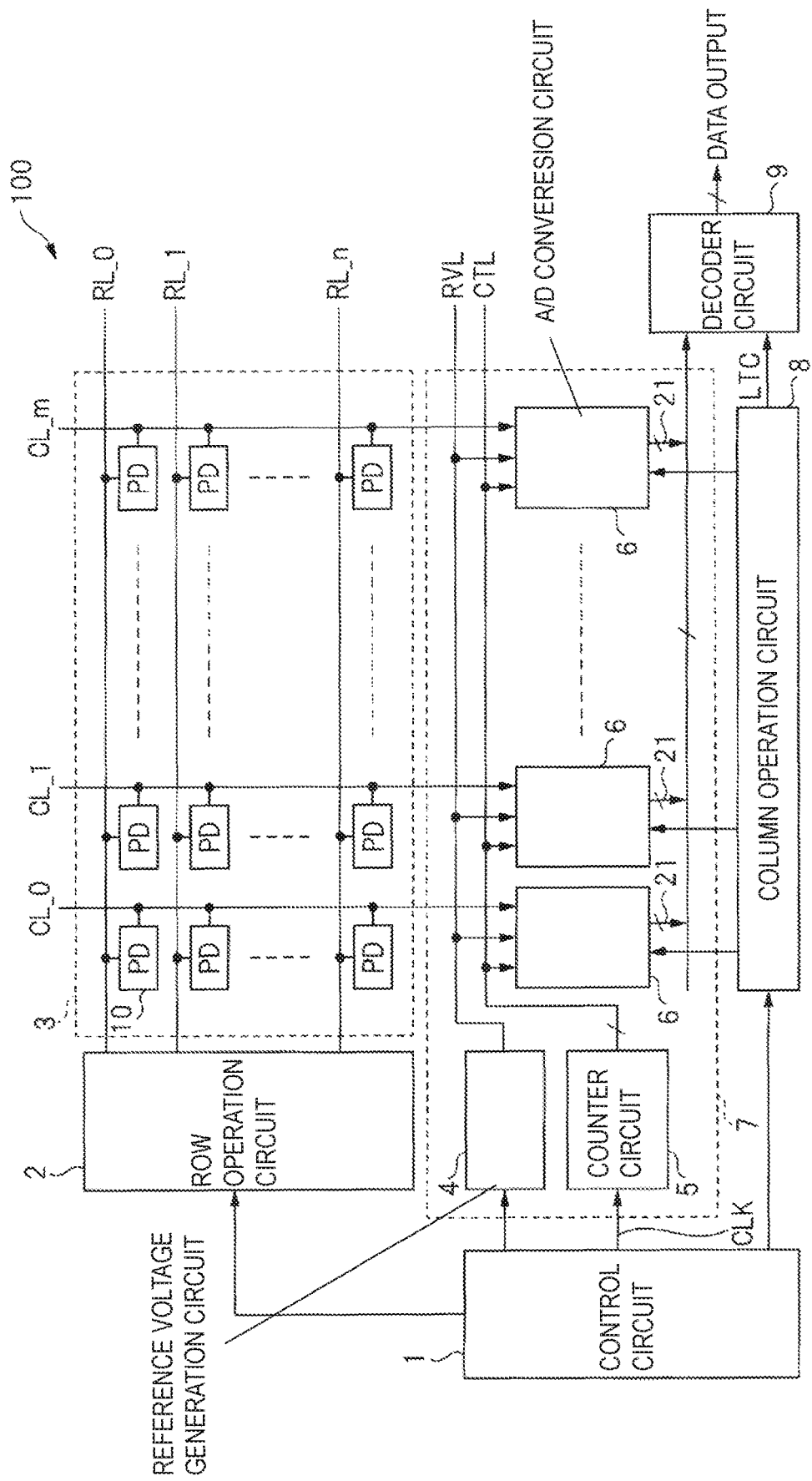
FIG. 1 is a block diagram showing a configuration of an image sensor related to first embodiment.

Embodiments of the present invention will be described below with reference to the drawings. It is to be noted that the disclosure is merely an example, and those skilled in the art can easily conceive of appropriate changes while maintaining the gist of the invention are naturally included in the scope of the invention. In addition, although the drawings may schematically represent the width, thickness, shape, and the like of each portion as compared with actual embodiments for the sake of clarity of description, the drawings are merely an example and do not limit the interpretation of the present invention.

In this specification and each drawing, the same reference numerals are assigned to the same elements as those described above with reference to the preceding drawings, and detailed description thereof may be omitted as appropriate.

FIG. 1 is a diagram showing a configuration of an image sensor related to first embodiment. The image sensor 100 includes a control circuit 1, a row operation circuit 2, a pixel portion 3, a column A/D conversion circuit 7, a column operation circuit 8, and a decoder circuit 9. In the first embodiment, the pixel portion 3 constituting the image sensor 100 and the above-described circuits are formed on one semiconductor chip by a well-known semiconductor manufacturing technique. That is, one semiconductor device includes the above-described pixel portion 3 and the above-described circuits.

The pixel portion 3 includes a plurality of photosensitive elements 10 arranged in a matrix, row control lines RL_0 to RL_n arranged in each row of the pixel portion 3, and column signal lines CL_0 to CL_m arranged in each column of the pixel portion 3. The photosensitive element 10 includes, for example, a photodiode PD, and is connected to a row control line arranged in a corresponding row and a column signal line arranged in a corresponding column.

The row operation circuit 2 is connected to the row control lines RL_0 to RL_n arranged in each row of the pixel portion 3, and controls the operation timing of each row of the pixel portion 3. For example, when acquiring an image, the row operation circuit 2 sequentially selects row control lines from a plurality of row control lines RL_0 to RL_n, and supplies a row control signal to the selected row control line. As a result, the plurality of photosensitive elements 10 connected to the row control line to which the row control signal is supplied are selected from the plurality of photosensitive elements 10 arranged in the pixel portion 3. In the selected photosensitive element 10, electronics are excited by light in the photodiode PD, and analog signals corresponding to the light are output to the column signal lines CL_0 to CL_m. The column signal lines CL_0 to CL_m are connected to the column A/D conversion circuit 7, and analog signals corresponding to light supplied to the column signal lines CL_0 to CL_m are converted into corresponding digital signals by the column A/D conversion circuit 7.

The column operation circuit 8 is connected to the column A/D conversion circuit 7, and controls the operation timing of each column. For example, the column operation circuit 8 controls the column A/D conversion circuit 7 so that the digital signals converted by the column A/D conversion circuit 7 are sequentially supplied to the decoder circuit 9. The decoder circuit 9 decodes the digital signal supplied from the column A/D conversion circuit 7 and outputs the decoded signal as a count value.

The control circuit 1 performs overall control. For example, the control circuit 1 controls the timing of operating the row operation circuit 2 and the column operation circuit 8. The control circuit 1 controls the operation of the reference voltage generation circuit 4 in the column A/D conversion circuit 7, which will be described later, and supplies a clock signal CLK to the counter circuit 5 in the column A/D conversion circuit 7.

The column A/D conversion circuit 7 includes a plurality of A/D conversion circuits 6 corresponding to each column of the pixel portion 3, a reference voltage generation circuit 4, and a counter circuit 5. Each of the A/D conversion circuit 6 is connected to a column signal line arranged in a corresponding column of the pixel portion 3. The reference voltage generation circuit 4 generates a ramp-wave reference voltage whose voltage changes linearly with the passage of time, and supplies a common reference voltage to the A/D conversion circuit 6 corresponding to each column via a common reference voltage line RVL. The counter circuit 5 generates a upper bit counter signal and a lower bit counter signal each composed of a plurality of bit counter signals based on the clock signal CLK from the control circuit 1, and outputs the upper bit counter signal and the lower bit counter signal to the counter signal line CTL arranged along the row of the pixel portion 3. The A/D conversion circuit 6 corresponding to each column is connected to the counter signal line CTL, and the upper bit counter signal and the lower bit counter signal generated by the counter circuit 5 are distributed to the A/D conversion circuit 6 corresponding to each column.

Since the A/D conversion circuit 6 corresponding to each column is supplied with a common reference voltage, a common upper bit counter signal and a common lower bit counter signal, the A/D conversion circuit 6 corresponding to each column can simultaneously convert the analog signals supplied via the column signal lines CL_0 to CL_m into digital signals.

In FIG. 1, LTC represents a latch signal. When the ramp-shaped reference voltage reaches a predetermined voltage and returns to the initial voltage, this is notified from the control circuit 1 to the column operation circuit 8, and the column operation circuit 8 generates the latch signal LTC. As will be described later, the A/D conversion circuit 6 divides the digital signal corresponding to the analog signal into a lower bit and an upper bit and outputs the divided digital signal. When the ramp-shaped reference voltage returns to the initial voltage, since the digital signal of the lower bit and the digital signal of the upper bit are supplied to the decoder circuit 9, the decoder circuit 9 latches the digital signal of the lower bit and the digital signal of the upper bit at the timing when the latch signal LTC is supplied, and decodes the latched digital signal. Although the latch signal LTC is output from the column operation circuit 8 in the drawing, the latch signal LTC may be output from the column A/D conversion circuit 7, the reference voltage generation circuit 4, or the control circuit 1.

In FIG. 1, a line drawn so as to intersect with a line indicates a plurality of lines. For example, since a line "/" crossing is drawn in the counter signal CTL, the counter signal line CTL is a plurality of counter signal lines. On the other hand, since the reference voltage line RVL is not provided with crossing lines, the reference voltage line is one wiring.

Figure 2:
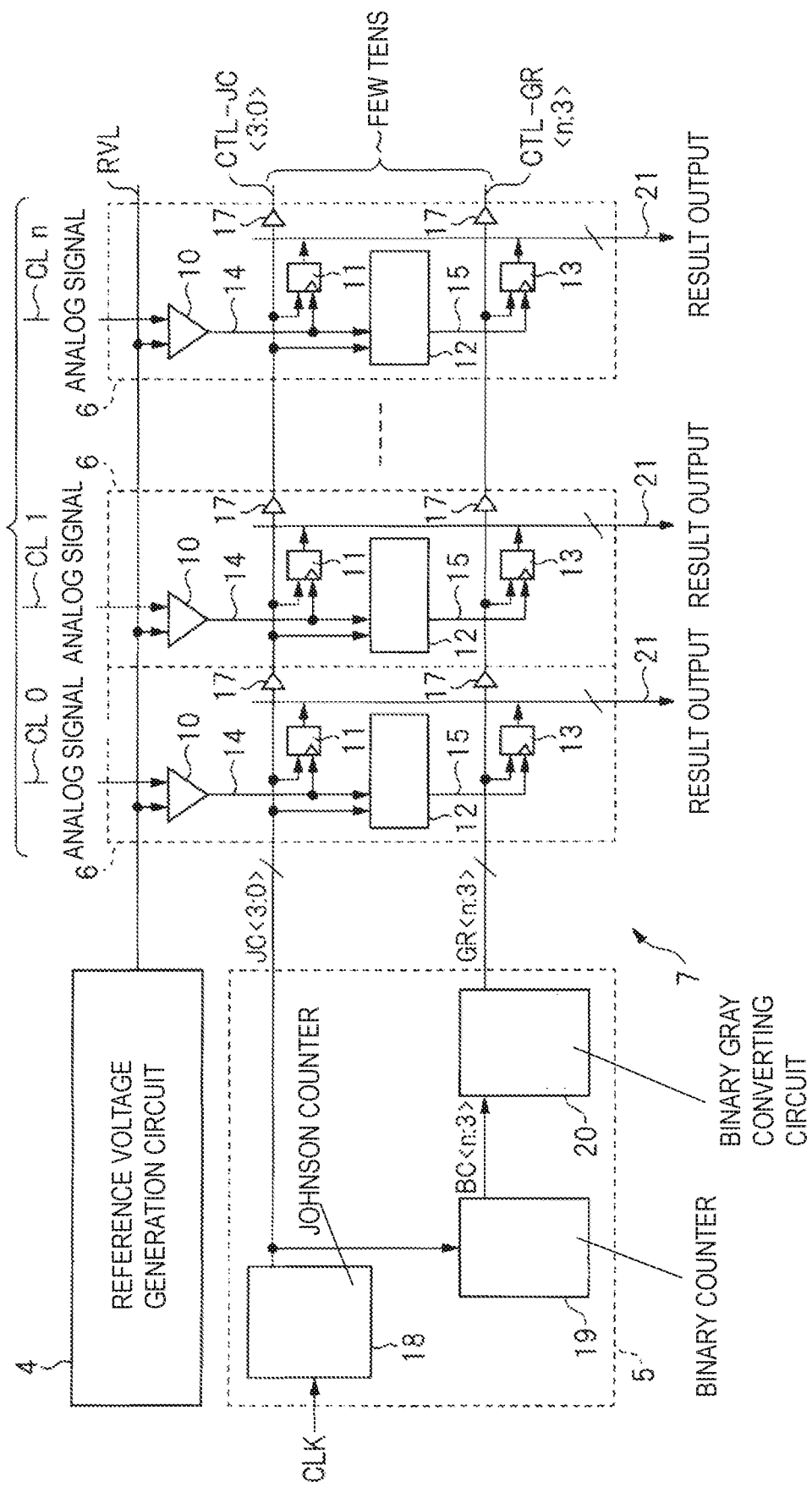
FIG. 2 is a block diagram showing the configuration of the column A/D converter circuit related to first embodiment.

FIG. 2 is a block diagram showing a configuration of a column A/D conversion circuit related to first embodiment.

The counter circuit 5 related to first embodiment includes a Johnson counter 18, a binary counter 19, and a binary gray converting circuit 20 for converting a binary code into a gray code.

The Johnson counter 18 generates multi-phase clock signals having phases different from each other based on the clock signal CLK. In first embodiment, a four-phase multi-phase clock signal is generated by the Johnson counter 18 and the generated multi-phase clock signal is provided to the counter signal line CTL-JC<3:0> as the lower bit counter signal JC<3:0>. The lower bit counter signal JC<3> of the multiphase clock signals generated by the Johnson counter 18 is supplied to the binary counter 19 as a clock signal. The binary counter 19 generates a binary code counter signal BC<n:3> by counting the supplied lower bit counter signal JC<3>.

A binary code counter signal BC<n:3> is converted to a gray code counter signal by a binary code conversion circuit 20 and fed from a binary gray conversion circuit 20 to a counter signal line CTL-GR<n:3> as a upper bit counter signal GR<n:3>. The counter signal lines CTL-JC<3:0> and the counter signal lines CTL-GR<n:3> are arranged so as to extend in parallel with the rows of the pixel portions 3.

The A/D conversion circuit 6 related to the first embodiment converts the analog signal supplied from the pixel portion 3 into an n-bit digital signal, and the A/D conversion circuit 6 outputs the n-bit digital signal as a set of the lower bit counter signal JC<3:0> and the upper bit counter signal GR<n:3>, each formed by a plurality of bits. In this case, the lower bit counter signal JC<3:0> represents the logical value on the lower bit side of the digital signal corresponding to the analog signal, and the lower bit counter signal JC<0> represents the logical value of the least significant bit on the lower bit side. That is, the lower bit counter signal JC<0> represents the change of the minimum change amount in the analog signal. In the lower bit counter signals JC<3:0>, in order of the lower bit counter signals JC<0>, JC<1>, JC<2>, and JC<3>, the logical values of the upper bits on the lower bit side are represented. Therefore, in the first embodiment, the upper bit counter signal GR<n:3> is generated based on the lower bit counter signal JC<3> representing the most significant bit. This upper bit counter signal GR<n:3> represents the logical value of the upper bit side of the digital signal corresponding to the analog signal. Note that n is determined by the resolution of the A/D conversion circuit 6.

Each of a plurality of A/D conversion circuits 6 corresponding to each column of the pixel portion 3 is configured by an integration type A/D conversion circuit. Since the configurations of the A/D conversion circuits 6 are the same as each other, the A/D conversion circuits 6 corresponding to the columns in which the column signal lines CL_0 are arranged will be described as a representative.

The A/D conversion circuit 6 includes a comparison circuit 10, a lower bit latch circuit 11, a determination circuit 12, and a upper bit latch circuit 13. The comparison circuit 10 is connected to the reference voltage line RVL and the wire signal line CL_0 of the corresponding column, and compares the reference voltage with the voltage of the analog signal from the column signal line CL_0. The comparison circuit 10 outputs the lower bit latch signal 14 at the timing when the relationship between the reference voltage and the analog signal is inverted as a result of comparison. For example, when the analog signal exceeds the reference voltage, the comparator circuit 10 outputs the lower bit latch signal 14 at the timing when the analog signal exceeds the reference voltage. In other words, when the relationship between the reference voltage and the analog signal reaches a predetermined relationship, the comparison circuit 10 outputs the lower bit latch signal 14 at that timing.

An input terminal of the lower bit latch circuit 11 is connected to counter signal lines CTL-JC<3:0> to which the lower bit counter signals JC<3:0> are supplied, and an output (lower bit latch result signal) terminal of the lower bit latch circuit 11 is connected to an output line 21. When the lower bit latch signal 14 is supplied from the comparison circuit 10, the lower bit latch circuit 11 latches the lower bit counter signal JC<3:0> supplied to the input at that time, and outputs the latched lower bit counter signal JC<3:0> to the output line 21.

A predetermined lower bit counter signal among the lower bit latch signal 14 and the lower bit counter signal JC<3:0> is supplied to the determination circuit (lower bit determination circuit) 12. The determination circuit 12 outputs an upper bit latch signal 15 indicating whether or not to latch the upper bit counter signal based on the lower bit latch signal 14 and a predetermined lower bit counter signal, which will be described later in detail with reference to FIGS. 4 and 5.

An input terminal of the upper bit latch circuit 13 is connected to the counter signal line CTL-GR<n:3>, which is supplied with the upper bit counter signal GR<n:3>, and an output terminal is connected to the output line 21. When the upper bit latch signal 15 is supplied from the determination circuit 12, the upper bit latch circuit 13 latches the upper bit counter signal GR<n:3> supplied to the input at that time, and outputs the latched upper bit counter signal (upper bit latch result signal) GR<n:3> to the output line 21.

In FIG. 2, reference numeral 17 denotes a repeater. The counter signal lines CTL-JC<3:0> and CTL-GR<n:3> become longer in order to distribute the lower bit counter signal and the upper bit counter signal to the A/D conversion circuit 6 corresponding to columns ranging from several thousands to several tens of thousands, and the lower bit counter signal and the upper bit counter signal are deteriorated due to losses in the counter signal lines and the like. Therefore, repeater 17 for shaping waveforms is connected at positions where the A/D conversion circuit 6 is arranged to the counter signal lines CTL-JC<3:0> and the counter signal lines CTL-GR<n:3>, respectively. Needless to say, it is not necessary to provide repeater 17 in all the A/D conversion circuit 6, and repeater 17 may be disposed as necessary in order to reliably transmit counter signals.

Figure 3:
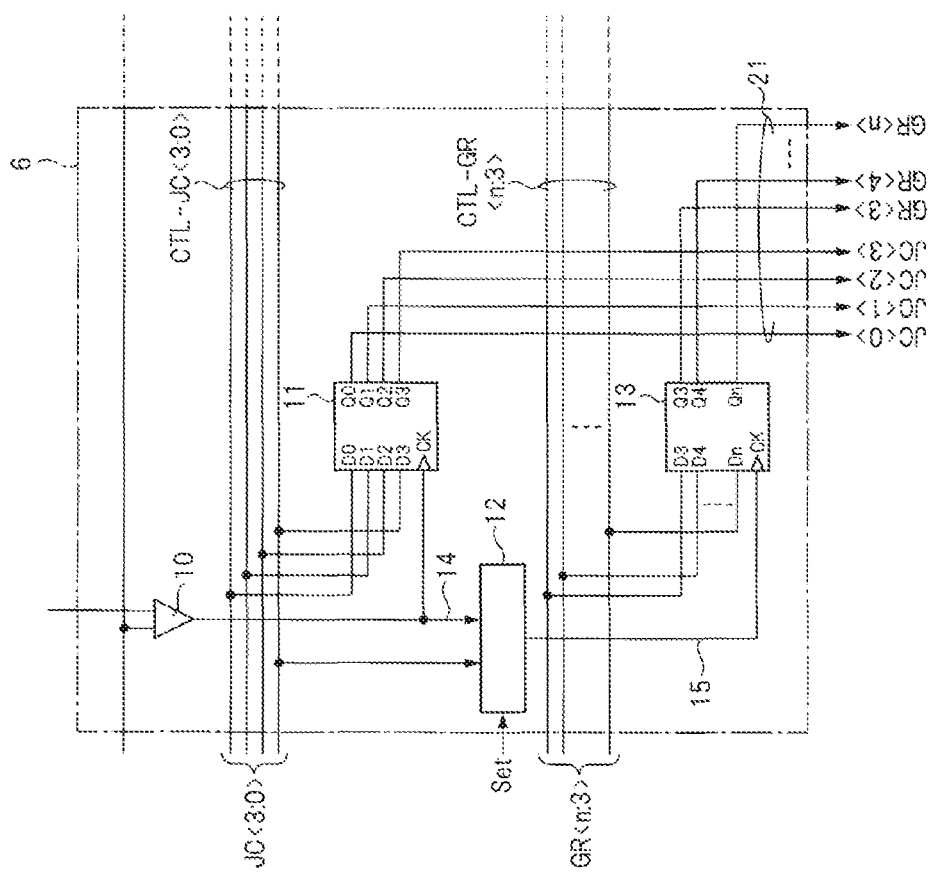
FIG. 3 is a block diagram showing the configuration of the A/D converter circuit according to the first embodiment.

FIG. 3 is a diagram showing a configuration of an A/D conversion circuit related to the first embodiment. As shown in FIG. 3, the lower bit latch circuit 11 has input terminals D0 to D3, output terminals Q0 to Q3, and a clock terminal CK. The input terminals D0 to D3 are connected to the counter signal line CTK-JC<3:0>, and the output terminals Q0 to Q3 are connected to the output signal lines JC<0> to JC<3>. At the timing when the voltage of the lower bit latch signal 14 supplied to the clock terminal CK is inverted to the low level, the lower bit latch circuit 11 latches the lower bit counter signals JC<3:0> supplied to the input terminals D0 to D3. The latched lower bit counter signals JC<3:0> are supplied to the output lines JC<0> to JC<3>.

The upper bit latch circuit 13 has input terminals D3 to Dn, output terminals Q3 to Qn, and a clock terminal CK. The input terminals D3 to Dn are connected to the counter signal line CTK-GR<n:3>, and the output terminals Q3 to Qn are connected to the output lines GR<3> to GR<n>. When the voltage of the upper bit latch signal 15 supplied to the clock terminal CK is inverted from a high level to a low level, the upper bit latch circuit 13 latches the high bit counter signal GR<n:3> supplied to the input terminals D3 to Dn. The latched upper bit counter signals GR<n:3> are supplied to the output lines GR<3> to GR<n>.

As shown in FIG. 3, since the output line 21 includes the output line JC<3:0> corresponding to the lower bit counter signal and the output line GR<n:3> corresponding to the upper bit counter signal, the lower bit counter signal latched by the lower bit latch circuit 11 and the upper bit counter signal latched by the upper bit latch circuit 13 are supplied to the decoder circuit 9 in parallel. Even if there is a time difference between the timing at which the lower bit latch circuit 11 latches and the timing at which the upper bit latch circuit 13 latches, the upper bit counter signal and the lower bit counter signal are simultaneously latched in the decoder circuit 9 by the latch signal LTC, and the latched counter signal is decoded as one digital signal.

In first embodiment, as shown in FIG. 3, the lower bit counter signal JC<3> is supplied to the determination circuit 12 as a predetermined lower bit counter signal. Although omitted in FIGS. 1 and 2, a set signal Set is supplied from the control circuit 1 to the determination circuit 12.

Figure 4:
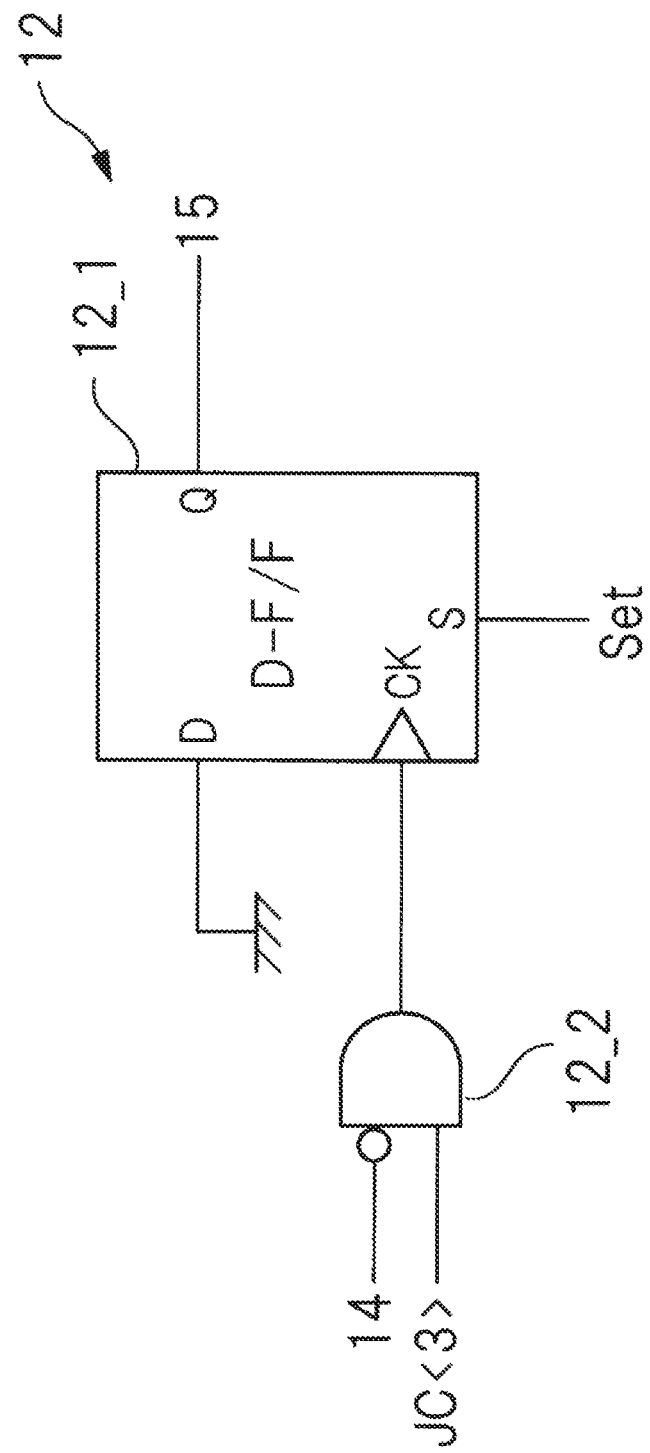
FIG. 4 is a block diagram showing the configuration of the determination circuit related to the first embodiment.

FIG. 4 is a diagram showing a configuration of a determination circuit related to first embodiment. FIG. 5 is a timing chart for explaining the operation of the determination circuit related to the first embodiment.

The determination circuit 12 includes a D-type flip-flop circuit (hereinafter referred to as a D-FF) 12_1 and an AND circuit 12_2 having an inverse function. A set signal Set is supplied from the control circuit 1 to the set terminal S of the D-FF 12_1, and a ground voltage (low level) is supplied to the input terminal D. In addition, the output of the AND circuit 12_2 is supplied to the clock terminal CK of D-F12_1, and the upper bit latch signal 15 is output from the output terminal D.

The AND circuit 12_2 is not specifically limited, but in first embodiment has two inputs. The first input of the AND circuit 12_2 is supplied with the lower bit latch signal 14 in phase inversion, and the second input is provided with the lower bit counter signal JC<3>.

D-FF12_1 latches low level signal supplied to terminal D in accordance with a change from a low level (logical value "0") to a high level (logical value "1") of the output signal supplied to the clock terminal CK from AND circuit 12_2, and outputs the upper bit latch signal 15 of low level from the output terminal Q. Further, when the set signal Set supplied to the set terminal S becomes to the high level, the D-FF 12_1 outputs the upper bit latch signal 15 output from the output terminal Q to the high level.

FIG. 5A shows the timing changing from the high level to the low level of the lower bit latch signal 14 at time t when the lower bit counter signal JC<3> is at the high level. At time t, since the lower bit latch signal 14 changes from a high level to a low level, the second input of the AND circuit changes from a low level to a high level. As a result, the upper bit latch signal 15 changes from the high level to the low level at time t in synchronization with the lower bit latch signal 14, as shown in FIG. 5A.

FIG. 5B shows the timing when the lower bit latch signal 14 changes from the high level to the low level in the period in which the lower bit counter signal JC<3> is at the low level. In this case, when the lower bit counter signal JC<3> changes from a low level to a high level (time t), the output of the AND circuit 12_2 changes from a low level to a high level. As a result, at time t, the upper bit latch signal 15 changes from the high level to the low level.

That is, in the period in which the lower bit counter signal JC<3> is at the low level, even if the lower bit latch signal 14 falls, the determination circuit 12 maintains the upper bit latch signal 15 at the high level, and changes the upper bit latch signal 15 from the high level to the low level when the high level of the lower bit counter signal JC<3> and the low level of the lower bit latch signal 14 occur simultaneously.

As a result, as shown in FIG. 5A, when the lower bit counter signal JC<3> is at the high level, the upper bit latch circuit 13 latches the upper bit counter signal GR<n:3> at the timing when the lower bit latch signal 14 changes to the low level. On the other hand, as shown in FIG. 5B, when the lower bit latch signal 14 changes to the low level in the period in which the lower bit counter signal JC<3> is at the low level, the upper bit latch circuit 13 latches the upper bit counter signal GR<n:3> waiting for the timing at which the lower bit counter signal JC<3> changes to the high level.

Figure 6:
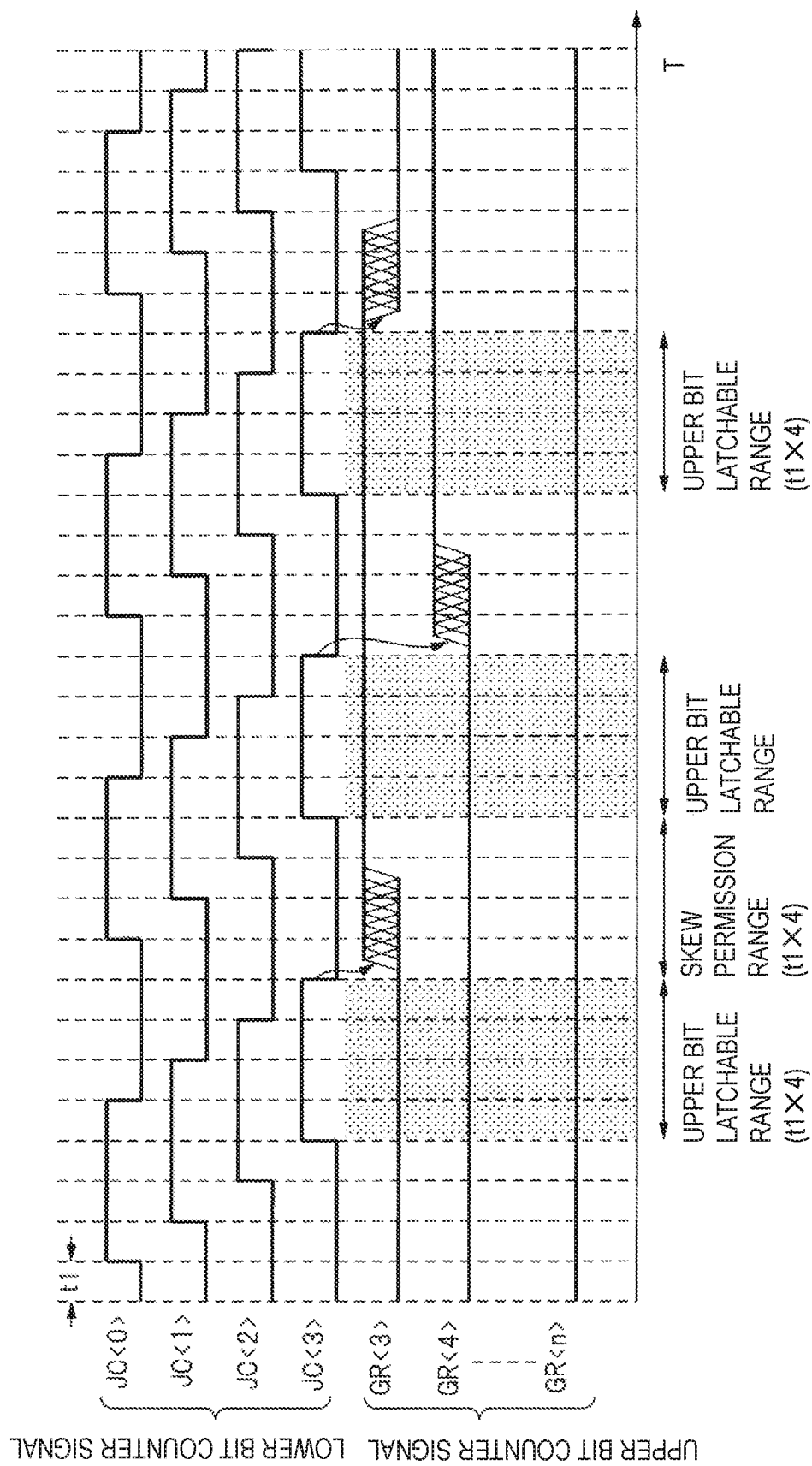
FIG. 6 is a timing diagram showing the operation of the A/D conversion circuit related to the first embodiment.

FIG. 6 is a timing chart showing the operation of the A/D conversion circuit related to first embodiment. The figure shows the times of the upper bit counter signal and the lower bit counter signal when no skew occurs in the counter signal. FIG. 7 is a conversion table showing the correspondences of counter signals, bit codes, and counter values outputted from the counter circuits related to first embodiment.

The analog signal supplied to the A/D conversion circuit 6 is converted into a digital count value corresponding to the value. Although not particularly limited, in first embodiment, the analog signal is converted into a bit code of a counter signal composed of lower bit counter signals JC<0> to JC<3> and upper bit counter signals GR<3> to GR<n>, and the analog signal is converted into counter values corresponding to the converted bit code.

In FIG. 7, the lower bit counter signals JC<0> to JC<3> shown in FIG. 6 are shown as JC<0> to JC<3>, and the upper bit counter signals GR<3> to GR<5> of the upper bit counter signals GR<3> to GR<5> shown in FIG. 6 are shown as GR<3> to GR<5>. In FIG. 6, the high level of the bit counter signal is shown as a logic value "1" in FIG. 7, and the low level is shown as a logic value "0". The counter value corresponds one-to-one to a combination (bit code) of the logical value of the lower bit counter signal and the higher bit counter signal, as shown in FIG. 7.

The lower bit counter signals JC<0> to JC<3> constitute a lower bit code, and the lower bit counter signal JC<0> corresponds to the least significant bit in the lower bit code, and the position in the lower bit code is upper in the order of JC<1>, JC<2>, and JC<3>. Similarly, the upper bit counter signals GR<3> to GR<5> constitute an upper bit code, the upper bit counter signal GR<3> corresponds to the least significant bit in the upper bit code, and the position in the upper bit code is upper in the order of GR<4> and GR<5>.

The Johnson counter 18 shown in FIG. 2 outputs multi-phase lower bit counter signals JC<0> to JC<3> shown in FIG. 6 by counting the clock signal CLK. That is, the Johnson counter 18 outputs the lower bit counter signals JC<0> to JC<3> whose voltages change at every time t1 corresponding to the smallest input voltage 1LSB of the A/D conversion circuit 6. In other words, the Johnson counter 18 outputs a lower bit code which changes by one bit at every time t1 corresponding to the minimum input voltage 1LSB. The cycle of each lower bit counter signal JC<3:0> is eight times the time t1. In other words, the cycle of the bit code on the lower side is eight times the time t1.

The binary counter 19 shown in FIG. 2 operates with the falling edge of the lower bit counter signal JC<3> as a trigger. The binary counter 19 and the binary gray conversion circuit 20 (FIG. 2) generate the upper bit counter signal GR<n:3> based on the lower bit counter signal JC<3>. The upper bit counter signal GR<n:3> corresponds to the gray code of n-2 bits. That is, the lower bit counter signal<3:0> corresponds to 3 bits on the lower side in the counter value after decoding, and the upper bit counter signal GR<n:3> corresponds to n-2 bits on the upper side.

Lower bit counter signals JC<3:0> and upper bit counter signals GR<n:3> are distributed by counter signal lines CTL-JC<3:0> and CTL-GR<n:3> to A/D conversion circuit 6 positioned in thousands to tens of thousands of columns as shown in FIG. 2.

The cycle in which the upper bit counter signal GR<n:3> changes becomes longer compared with the cycle in which the lower bit counter signal JC<3:0> changes. That is, the frequency of the lower bit counter signal JC<3:0> is higher than the frequency of the higher bit counter signal GR<n:3>. By the increase in frequency, the voltage drop on the counter signal line to be distributed in the lower bit counter signal increases as compared with the upper bit counter signal having a low frequency. Therefore, a skew (time difference) may occur between the lower bit counter signal and the upper bit counter signal reaching the A/D conversion circuit 6.

Also, even when the parasitic capacitance and the parasitic resistance associated with the counter signal line for distributing the upper bit counter signal and the lower bit counter signal are different due to the influence of the adjacent counter signal line or/and other wiring, skew may occur between the bit counter signals reaching the A/D conversion circuit 6.

Furthermore, as shown in FIG. 2, even when the circuit for generating the lower bit counter signal JC<3:0> and the upper bit counter signal GR<n:0> are different, skew may be generated between the lower bit counter signal and the upper bit counter signal.

When the skew occurs, for example, the change timing of the upper bit counter signal GR may be delayed from several tens ps to several ns with respect to the change of the lower bit counter signal JC<3>.

As described with reference to FIGS. 4 and 5, the determination circuit 12 maintains the upper bit latch signal 15 at the high level during the period in which the lower bit counter signal JC<3> is at the low level. Therefore, in FIG. 6, in the period in which the lower bit counter signal JC<3> is at the low level, even if the change timing of the upper bit counter signal GR<n:3> fluctuates due to the skew, the upper bit counter signal GR<n:3> is not latched by the upper bit latch circuit 13. That is, the period in which the lower bit counter signal JC<3> is at the low level is a skew permission period (permission range) in which the occurrence of skew is permitted. If the variation of the upper bit counter signal caused by the skew is considered to be a state in which the upper bit counter signal is indefinite, the skew enable period can be considered to be an indefinite period that allows the upper bit counter signal to be indefinite.

On the other hand, during the period in which the lower bit counter signal JC<3> is at the high level, the determination circuit 12 changes the upper bit latch signal 15 to the low level in response to the change of the lower bit latch signal 14 to the low level. Therefore, in FIG. 6, the period in which the lower bit counter signal JC<3> is at the high level (range indicated by dots) becomes the upper bit latchable period (possible range) in which the upper bit counter signal can be latched. In first embodiment, each of the skew enable period and the upper bit latchable period is half of the period of the lower bit counter signal (time t1×4) and occurs alternately so as not to overlap with each other in time. In other words, the period excluding the indefinite period becomes the upper bit latchable period, and in this period, the determination circuit 12 generates the upper bit latch signal 15 of the low level and allows the upper bit latch circuit 13 to latch the upper bit counter signal.

Figure 8:
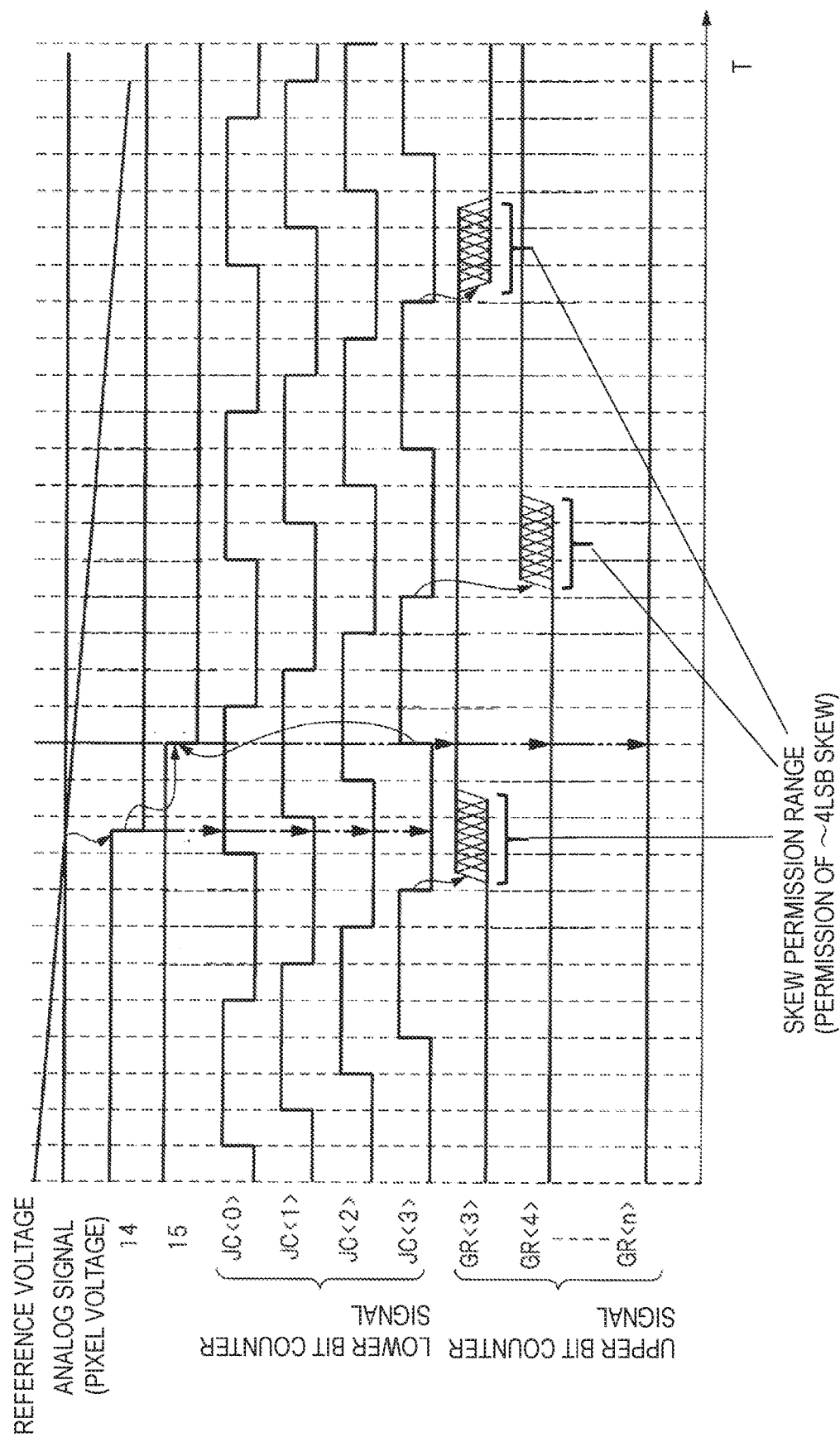
FIG. 8 is a timing diagram for explaining the operation of an A/D switching circuit related to a first embodiment.
Figure 9:
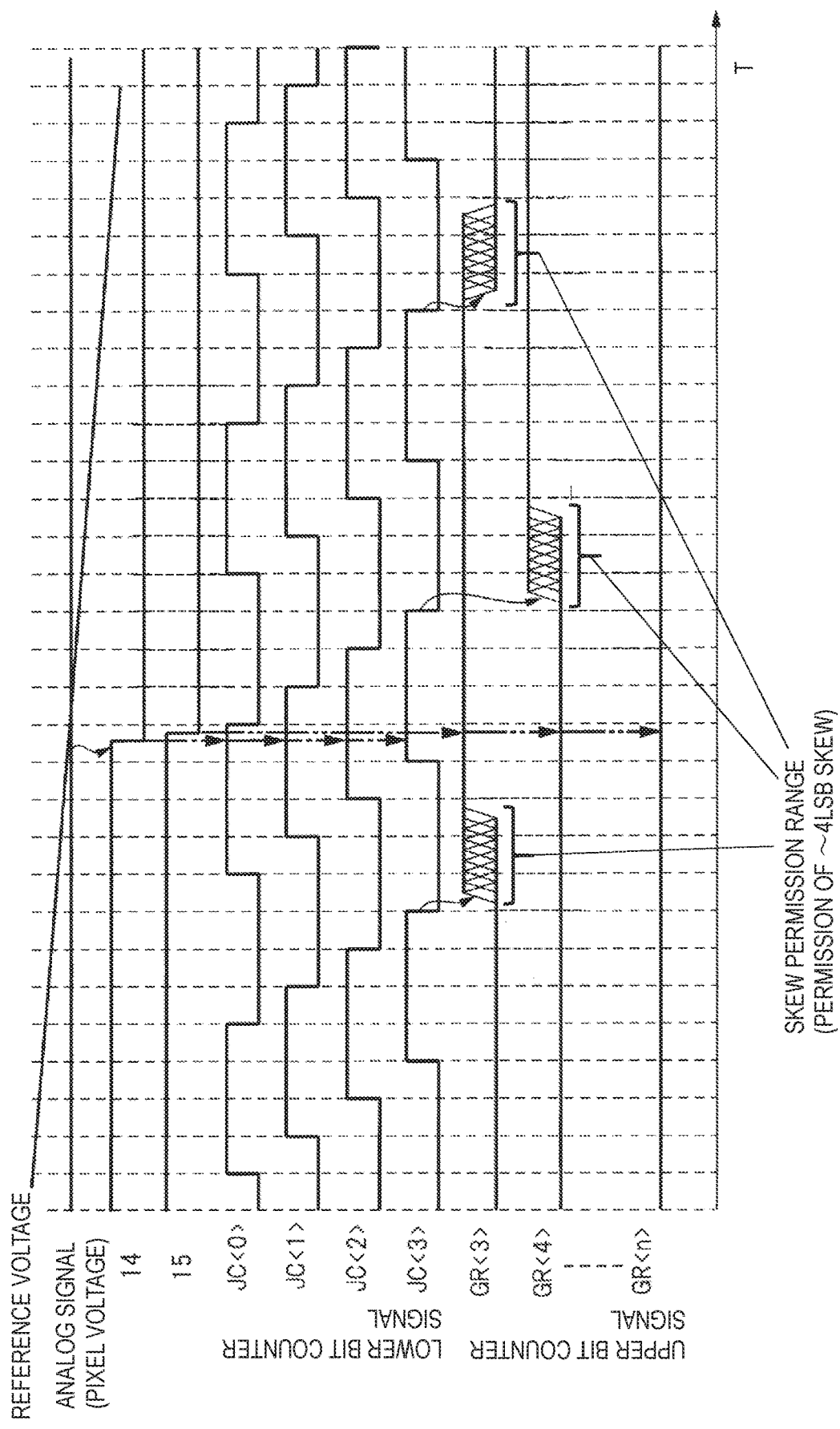
FIG. 9 is a timing diagram for explaining the operation of the A/D conversion circuit related to the first embodiment.

Next, an operation when skew occurs will be described. FIGS. 8 and 9 are timing diagrams for explaining the operation of the A/D conversion circuit related to the first embodiment. FIG. 8 shows the timing when the lower bit latch signal 14 falls from the high level to the low level in the period in which the lower bit counter signal JC<3> is at the low level. On the other hand, FIG. 9 shows the timing when the lower bit latch signal 14 falls from the high level to the low level in the period in which the lower bit counter signal JC<3> is at the high level. Here, the operation of the A/D conversion circuit 6 corresponding to one column of the pixel portion 3 will be described, but the operation of the A/D conversion circuit 6 corresponding to the remaining columns of the pixel portion 3 is also the same.

As shown in FIGS. 8 and 9, the reference voltage generation circuit 4 shown in FIG. 1 generates a reference voltage whose voltage varies linearly with the passage of time. Although FIG. 8 and FIG. 9 show a reference voltage whose voltage decreases with the passage of time, the reference voltage may be a voltage whose value increases with the passage of time.

The pixel voltage is supplied with a pixel voltage from the pixel portion 3 as an analog signal to the A/D conversion circuit 6. When the voltage is inverted between the analog signal and the reference voltage, the lower bit latch signal 14 outputting from the comparison circuit 16 (FIG. 2) falls from the high level (H) to the low level (L), as shown in FIGS. 8 and 9. The Johnson counter 18 counts the clock signal CLK and outputs the lower bit counter signal JC<3:0>. The lower bit counter signals JC<3:0> shown in FIGS. 8 and 9 are the same as the lower bit counter signals JC<3:0> described with reference to FIG. 6.

Figure 17:
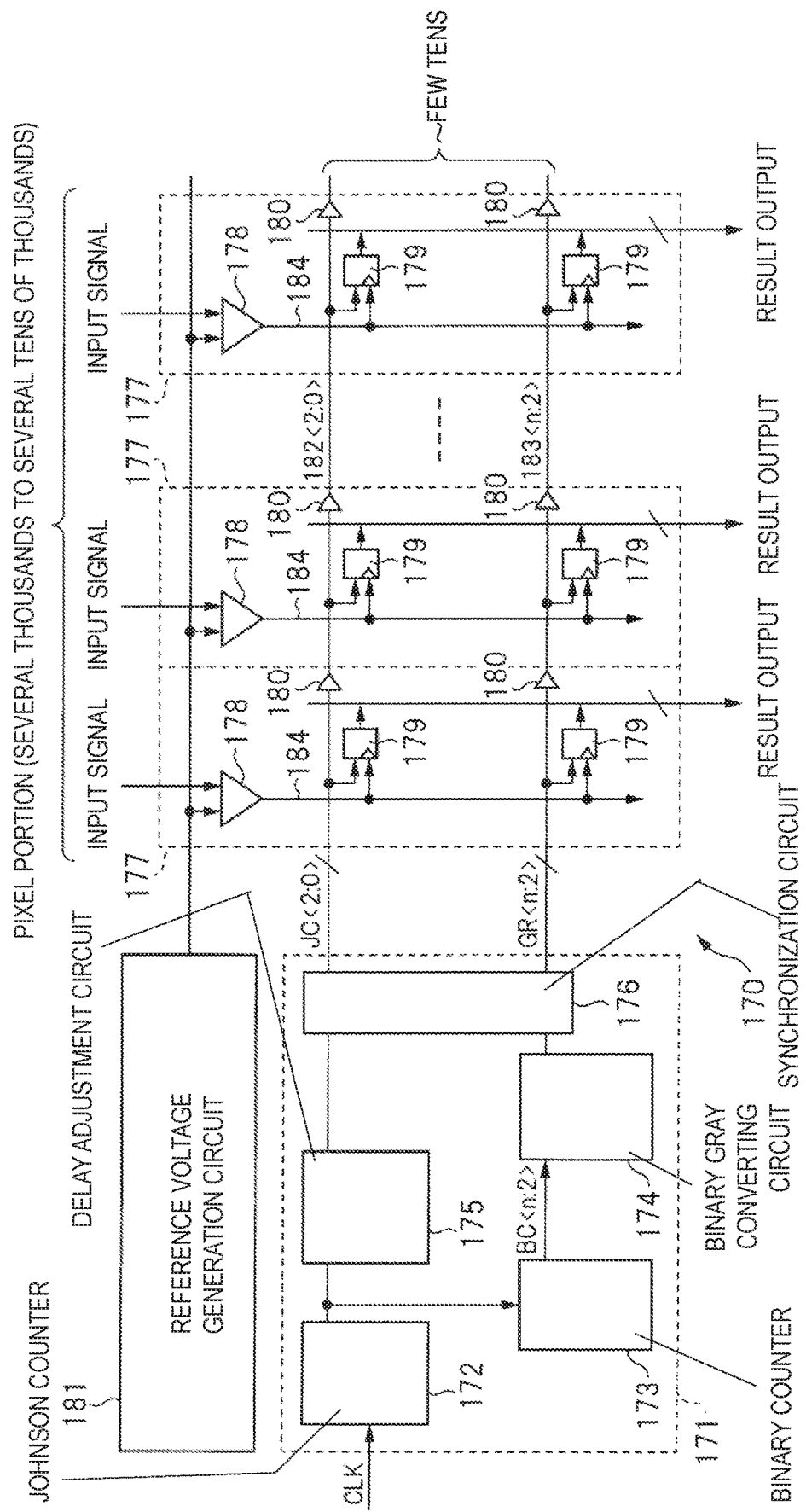
FIG. 17 is a block diagram showing the configuration of the integration type A/D conversion circuit of the comparative examples considered by the inventors.
Figure 18:
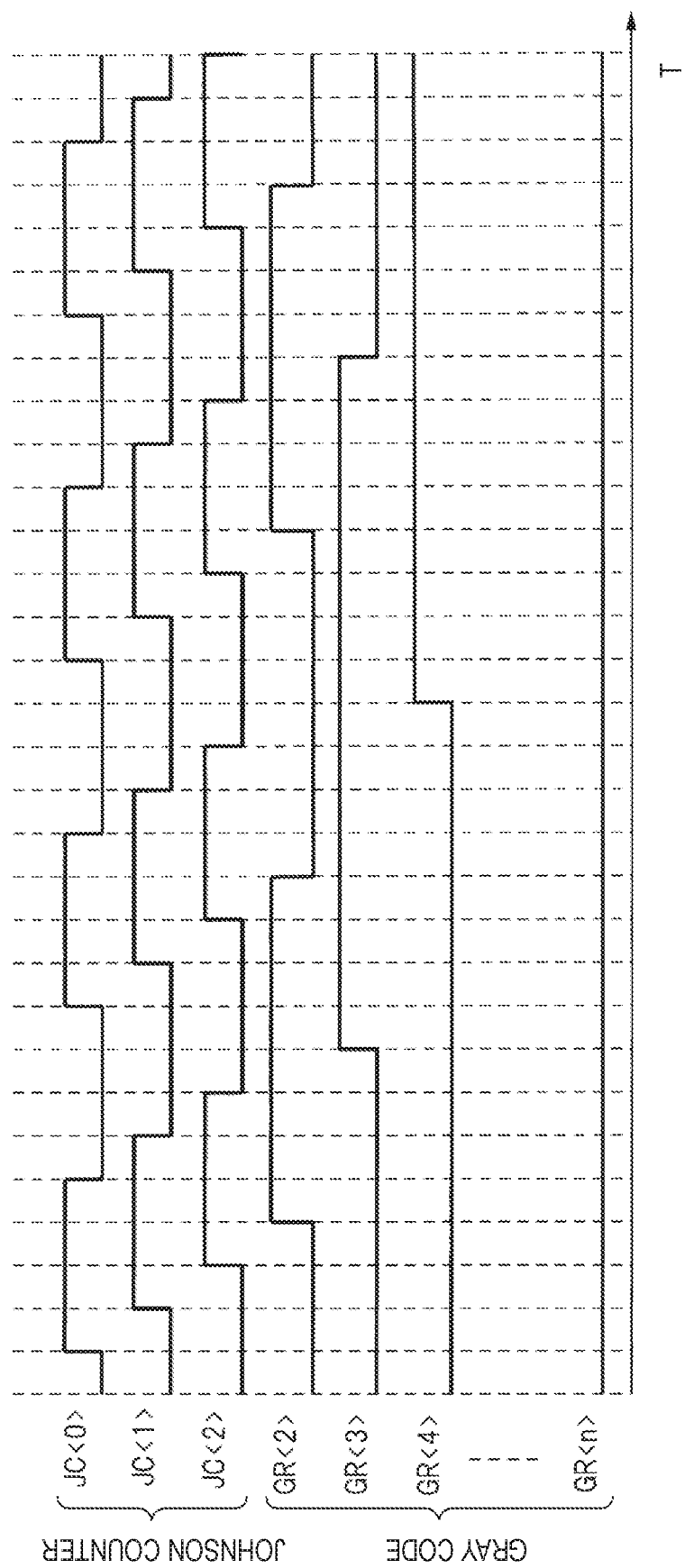
FIG. 18 is a timing diagram showing the timing of the lower bit counter signal and the upper bit counter signal.
Figure 20:
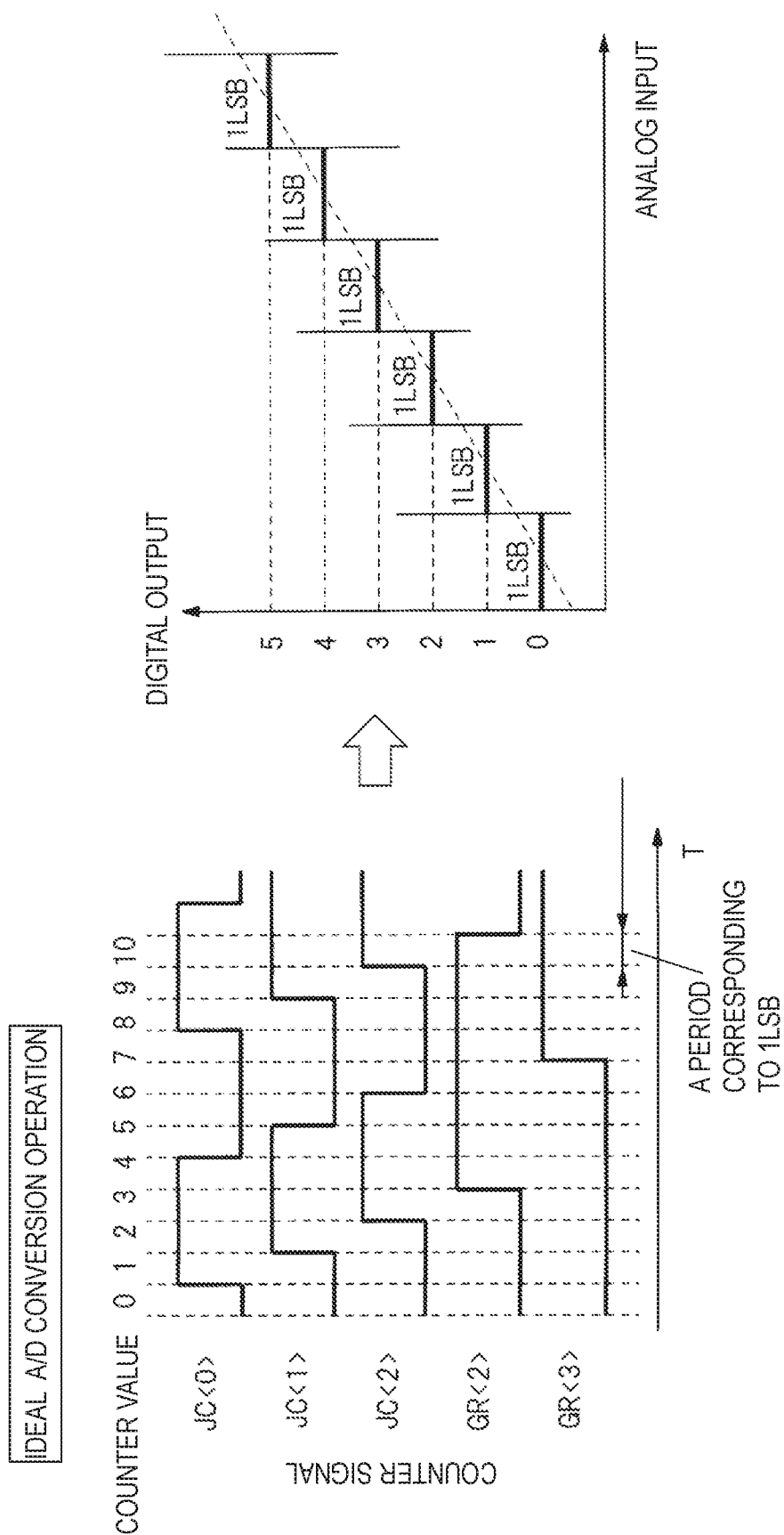
FIG. 20 is a diagram of the A/D conversion operation when an ideal A/D conversion is performed in a comparison example.
Figure 21:
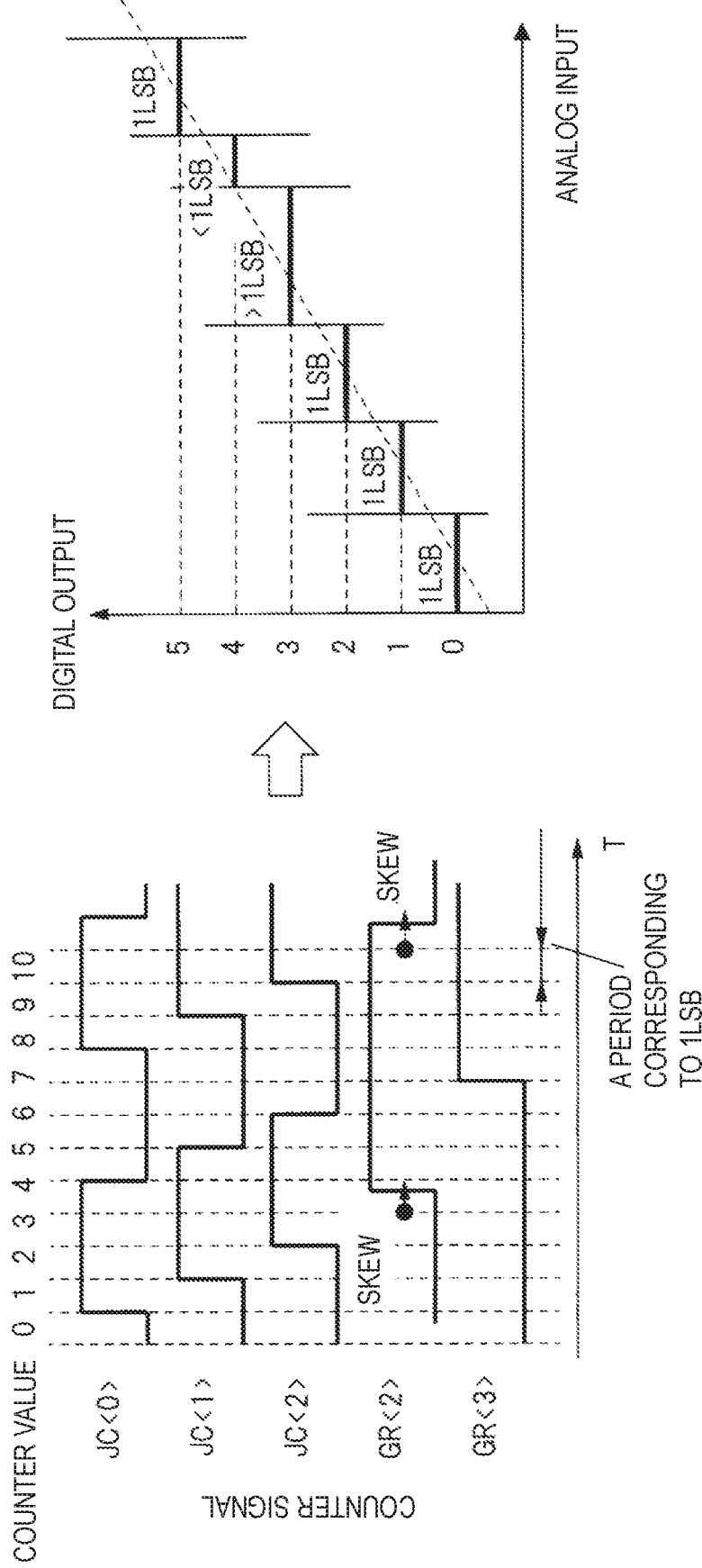
FIG. 21 is a diagram of the A/D conversion operation when DNL degradation occurs in a comparative example.
Figure 22:
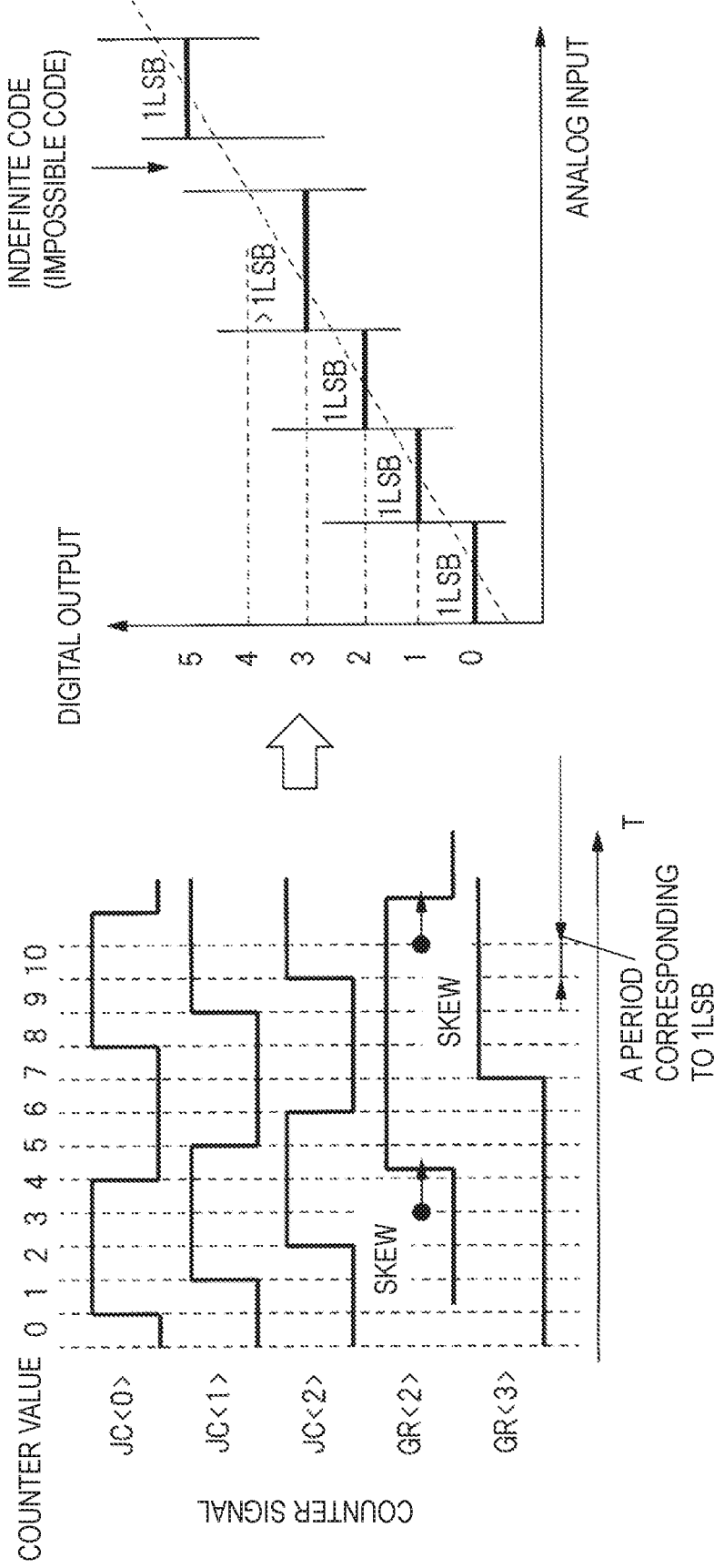
FIG. 22 is a diagram of the A/D conversion operation when the delay caused by the skew increases in the comparative example.

In FIG. 8, a dashed-dotted line indicates the timing of latching the lower bit counter signal JC<3:0>. In the case of the comparative example described with reference to FIG. 17, both the lower bit counter signal and the upper bit counter signal are latched at the timing indicated by the one-dot chain line. That is, both the lower bit counter signal JC<3:0> and the higher bit counter signal GR<n:3> are latched by the lower bit latch signal 14 by falling to the low level. In the case of the comparative example, when the change of the upper bit counter signal GR<n:3> is delayed with respect to the change of the lower bit counter signal JC<3> due to the skew, the upper bit counter signal of an incorrect voltage level is latched depending on the delay amount.

For example, when the upper bit counter signal GR<3> rises in response to the falling of the lower bit counter signal JC <3>, the rising of the upper bit counter signal GR<3> is delayed due to the skew, even when the lower bit latch signal 14 falls, assuming that the upper bit counter signal GR<3> is at the low level, the incorrect high level upper bit counter signal GR<3> is latched.

On the other hand, in the first embodiment, while the lower bit counter signal JC<3> is at the low level, it is in the skew enable range, and the upper bit latch signal 15 falls when the lower bit counter signal JC<3> next rises to the high level. Therefore, the upper bit latch circuit 13 latches the upper bit counter signal GR<n:3> at the timing indicated by the two-dot chain line. As a result, even if the rising edge of the upper bit counter signal GR<3> is delayed by the skew, the upper latch circuit 13 can latch the upper bit counter signal GR<3> of the correct high level.

Although the upper bit counter signal GR<3> has been described as an example, even when the rising edge of the upper bit counter signals GR<4> to GR<n> is delayed, the upper bit latch circuit 13 can latch the upper bit counter signals GR<4> to GR<n> of the correct voltage level (high level). Similarly, even when the falling edges of the upper bit counter signals GR<3> to GR<n> are delayed by the skew, the upper latch circuit 13 can latch the upper bit counter signals GR<3> to GR<n> of the correct voltage level (low level).

As shown in FIG. 9, when the lower bit latch signal 14 falls from the high level to the low level in the period in which the lower bit counter signal JC<3> is at the high level, the lower bit latch circuit 11 latches the lower bit counter signal JC<3:0> at that time at the timing shown by the one-dot chain line, and the upper bit latch circuit 13 latches the upper bit counter signal GR<n:3> at that time at the timing shown by the two-dot chain line. Therefore, even if the rising edge and/or the falling edge of the upper bit counter signal GR<n:3> is delayed due to skew, for example, the upper bit latch circuit 13 can latch the upper bit counter signal GR<n:3> of the correct voltage.

Although not shown in FIGS. 6 to 8, the set signal Set shown in FIG. 4 is generated every time one A/D conversion is completed. When the set signal Set is generated, the determination circuit 12 sets the voltage of the upper bit latch signal 15 to a high level.

In the example described above, the conversion circuit 12 generates the upper bit latch signal 15 based on the lower bit counter signal JC<3>, but the present invention is not limited thereto. The conversion circuit 12 may generate the upper bit latch signal 15 based on any of the lower bit counter signals JC<0> to JC<2> instead of the lower bit counter signal JC<3> in consideration of a period in which the change of the upper bit counter signal GR<n:3> changes due to skew. For example, if the lower bit counter signal JC<0> is used instead of the lower bit counter signal JC<3>, a period in which the lower bit counter signal JC<0> is at the low level can be set as the skew permission range.

In first embodiment, the most accurate time information, including the time t1 corresponding to the minimum input voltage 1LSB, is aggregated into the lower bit counter signal JC<3:0> generated by the Johnson counter. Since the lower bit counter signals JC<3:0> are generated by the Johnson counter, it is possible to prevent the change timing from varying due to the skew between the lower bit counter signals JC<3:0>. On the other hand, the upper bit counter signal GR<n:3> can be latched at a sufficiently stable time by the upper bit latch signal 15 even if the lower bit counter signal JC<3:0> varies within the skew allowable range which is the time t1×4 corresponding to the 4LSB. As a result, performance deterioration such as DNL deterioration and malfunction of the A/D conversion circuit can be prevented.

Since the upper bit latch signal 15 latches the upper bit counter signal GR<n:3> at an appropriate timing, it is not required to ensure sufficient synchronization between the lower bit counter signal JC<3:0> and the upper bit counter signal GR<n:3> in the counter circuit 5 when generating the lower bit counter signal JC<3:0> and the upper bit counter signal GR<n:3>. Further, since the upper bit counter signal is latched by the upper bit latch signal 15 in each of the A/D conversion circuits 6 positioned to a plurality of columns, high-precision delay adjustment is not required when distributing the counter signal generated by the counter circuit 5 to a plurality of A/D conversion circuits 6. As a result, the A/D conversion circuit can realize an improvement in speed and DNL, and the image sensor can improve performance such as a high frame rate, a high image quality, and a large number of pixels.

Figure 10:
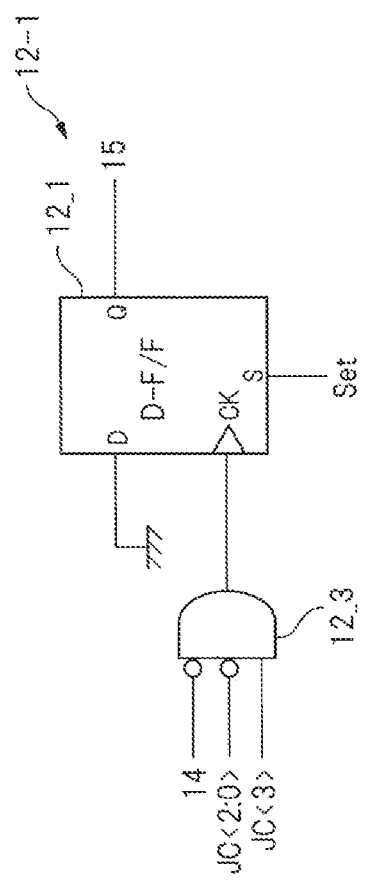
FIG. 10 is a block diagram showing the configuration of the determination circuit related to the second embodiment.
Figure 11:
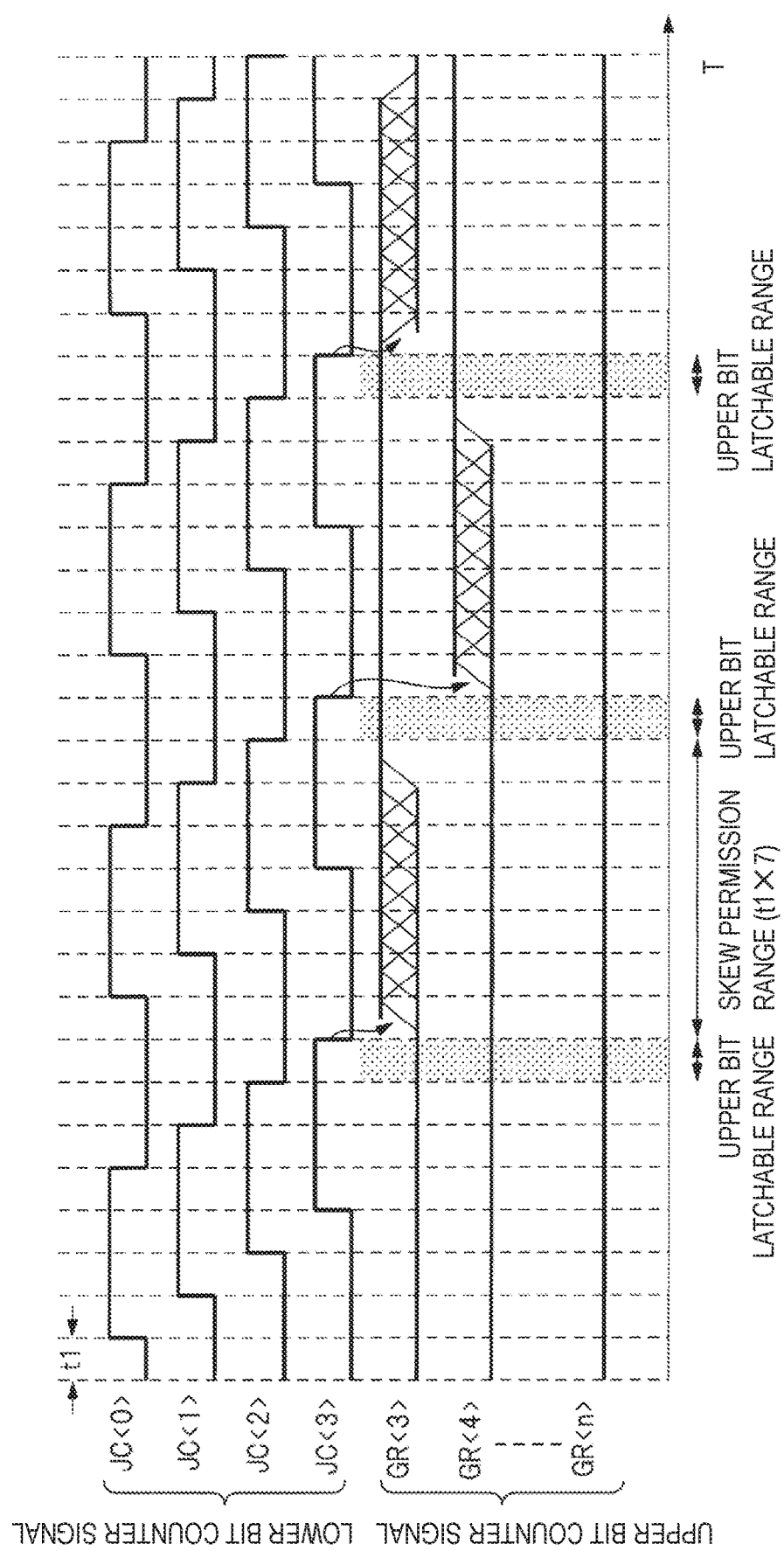
FIG. 11 is a timing diagram showing the operation of the A/D conversion circuit related to the second embodiment.

(Second embodiment) FIG. 10 is a block diagram showing the configuration of a determination circuit related to second embodiment. FIG. 11 is a timing chart showing the operation of the A/D conversion circuit related to the second embodiment. The second embodiment provides an A/D conversion circuit capable of preventing degradation of characteristics even when fluctuations in the upper bit counter signals GR<n:3> are larger than first embodiment.

In the second embodiment, the determination circuit 12 shown in FIG. 2 is changed to the determination circuit 12-1 shown in FIG. 10. The other configuration is the same as that of the first embodiment except that the determination circuits are changed.

Determination circuit 12-1 includes D-FF12_1 and an AND circuit 12_3. The D-FF 12_1 is similar to the D-FF described in FIG. 4. The difference is that the clock terminal CK is supplied with the output of the AND circuit 12_3 instead of the AND circuit 12_2. The number of input of the AND circuit 12_3 is larger than that of the AND circuit 12_2. That is, the AND circuit 12_3 includes an input in which the lower bit latch signal 14 is inverted and supplied, an input in which each of the lower bit counter signals JC<0> to JC<2> is inverted and supplied, and an input in which the lower bit counter signal JC<3> is supplied.

The AND circuit 12_3 outputs a high level when each of the lower bit counter signals JC<0> to JC<2> and the lower bit latch signal 14 becomes a low level and the lower bit counter signal JC<3> becomes a high level. When the output of the AND circuit 12_3 changes to a high level, D-F12_1 captures the ground voltage supplied to the input terminal D and outputs the upper bit latch signal 15 at the lower level.

FIG. 11 is similar to FIG. 6. The difference is that the skew permission range is longer and the upper bit latchable range in which the upper bit counter signal can be latched is shorter than that in FIG. 6. That is, the determination circuit 12-1 can output the upper bit latch signal 15 at the low level only in the period in which the lower bit counter signals JC<0> to JC<2> are at the low level and the lower bit counter signal JC<3> is at the high level. Therefore, only this period becomes the upper bit latchable range, and the other periods become the skew permission range. In this example, the skew permission range is time t1×7. In this skew permission range, even if the upper bit counter signal GR<n:3> fluctuates, the upper bit latch circuit 13 does not latch the upper bit counter signal GR<n:3>, and can latch the upper bit counter signal GR<n:3> only in the upper bit latchable range.

Therefore, even if the upper bit counter signal GR<n:3> fluctuates significantly, it is possible to prevent the A/D conversion circuit from deteriorating.

As the speed of the A/D conversion circuit increases further, it is considered that the range of variation of the upper bit counter signal GR<n:3> caused by the skew is insufficient in the skew allowable range (t1×4) corresponding to the 4LSB. In second embodiment, the skew allowable range is the time equivalent to the 7LSB (t1×7). Therefore, it is possible to prevent the A/D conversion circuit from deteriorating even if there is a delay due to a skew corresponding to the maximum 7LSB of the upper bit counter signal GR<n:3>.

In the determination circuit 12-1, the period in which the lower bit counter signals JC<0> to JC<2> are at the low level and the lower bit counter signal JC<3> is at the high level is set as the upper bit latchable range, but the present invention is not limited thereto. The combination of lower bit counter signals supplied to the AND circuit 12_3 may be changed so that the timing at which the most margin can be secured is the upper bit latchable range for the range where the upper order bit counter signal GR<n:3> fluctuates. For example, if the inversion signals of the lower bit counter signals JC<1> to JC<3> and the lower bit counter signal JC<0> are changed so as to be supplied to the AND circuit

12_3, the period in which only the lower bit counter signal JC<0> is at the high level can be changed to the upper bit latching range.

Figure 12:
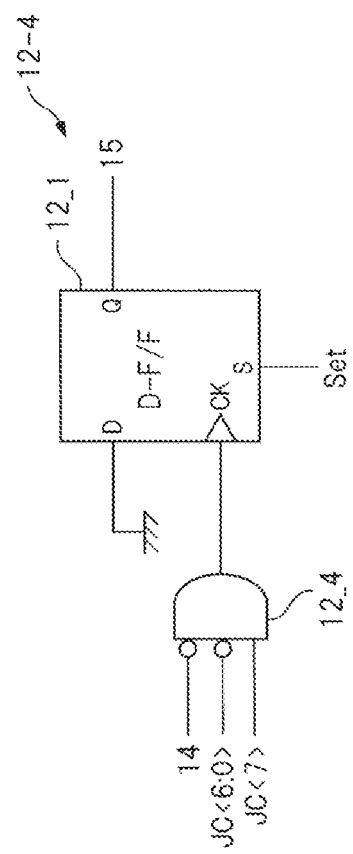
FIG. 12 is a block diagram showing the configuration of the determination circuit related to the third embodiment.
Figure 13:
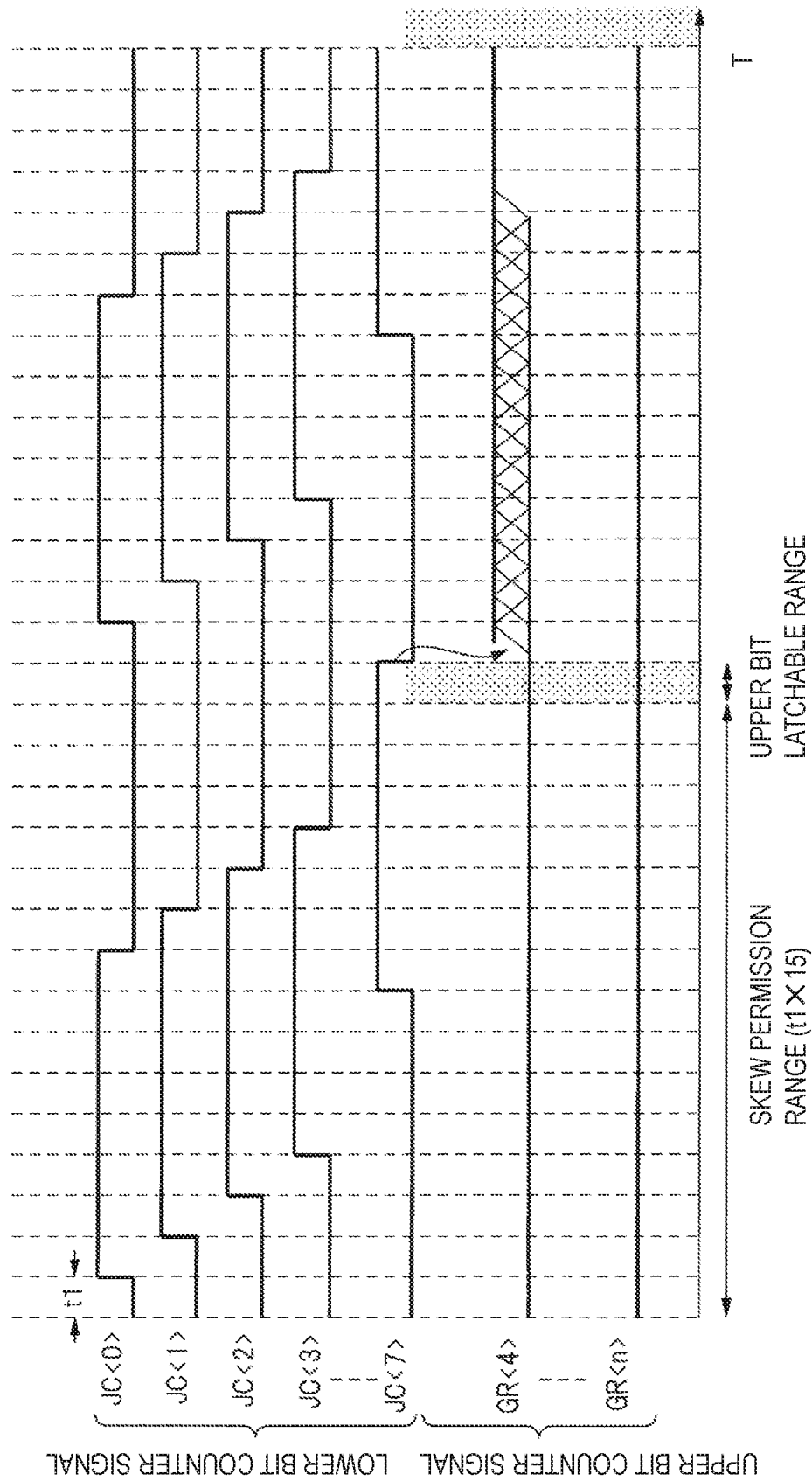
FIG. 13 is a timing diagram showing the operation of the A/D conversion circuit related to the third embodiment.

(Third embodiment) FIG. 12 is a block diagram showing the configuration of a determination circuit related to third embodiment. FIG. 13 is a timing chart showing the operation of the A/D conversion circuit related to the third embodiment. In second embodiment, the skew allowable range is widened without changing the lower bit counter signal and the upper bit counter signal. Third embodiment provides an A/D conversion circuit having a wider skew grant range by increasing the number of bits of the multiphase clock signal generated by the Johnson counter 18, i.e., the number of lower bit counter signals.

In the third embodiment, the Johnson counter 18 shown in FIG. 2 is changed so that eight lower bit counter signals JC<0> to JC<7> are formed, and the binary counter 19 and the binary gray converter 20 are changed so as to generate the upper bit counter signals GR<4> to GR<7> of the gray code by counting the lower bit counter signals JC<7>.

The determination circuit 12-4 shown in FIG. 12 is similar to the determination circuit shown in FIG. 10. The difference is that the AND circuit 12_4 is used instead of the AND circuit 12_3. The AND circuit 12_4 has an input to which a signal obtained by inverting the lower bit latch signal 14 is supplied, an input to which a signal obtained by inverting each of the lower bit counter signals JC<0> to JC<6> is supplied, and an input to which the lower bit counter signal JC<7> is supplied.

By using the determination circuit 12-4 configured as described above, as shown in FIG. 13, only the period in which the lower bit counter signal JC<6:0> is at the low level and the lower bit counter signal JC<7> is at the high level becomes the upper bit latchable range, and the remaining period becomes the skew permissible range. In this example, the skew permission range is a time (t1×15) corresponding to 15 LSBs. That is, the variation of the upper bit counter signal GR<n:4> caused by the skew is mitigated to a period equivalent to 15LSB.

In the third embodiment, as with the second embodiment, the upper bit latchable range can be changed depending on the variation range of the upper bit counter signal by changing the combination of the lower bit counter signals supplied to the AND circuit 12_4.

Figure 14:
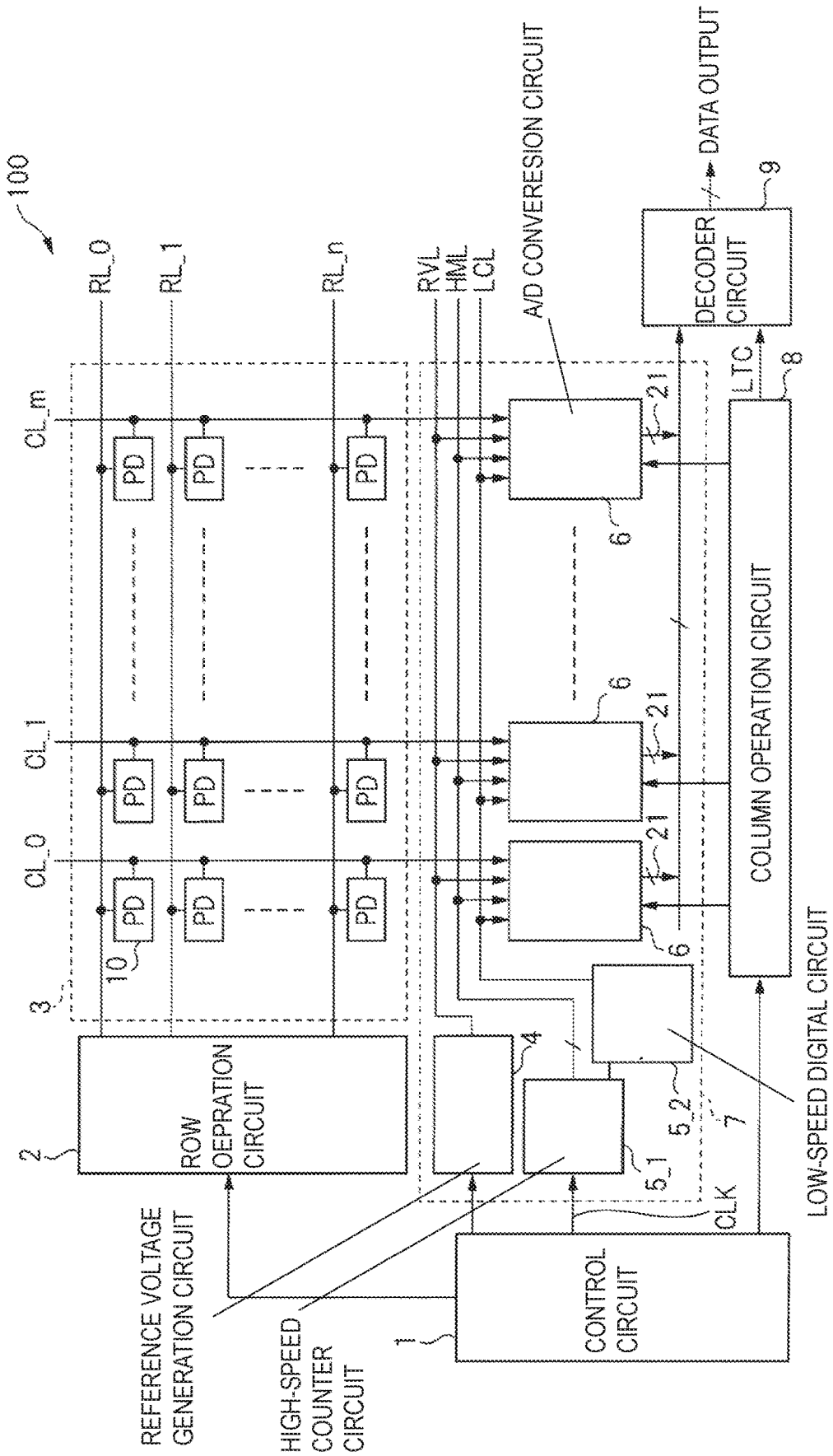
FIG. 14 is a block diagram showing a configuration of an image sensor related to fourth embodiment.

(Fourth embodiment) FIG. 14 is a block diagram showing the configuration of an image sensor related to fourth embodiment. Since FIG. 14 is similar to FIG. 1, the main differences will be explained. The difference is that in FIG. 14, the counter circuit 5 of FIG. 1 is configured by the high-speed counter circuit 5_1 and the low-speed digital circuit 5_2, and the counter signal line CTL is configured by the multi-phase clock signal line HML and the low-speed signal line LCL.

The clock signal CLK from the control circuit is supplied to the high-speed counter circuit 5_1. Based on the supplied clock signal CLK, the high-speed counter circuit 5_1 generates a multi-phase clock signal whose phase differs by, for example, a period corresponding to 1LSB, and supplies the generated multi-phase clock signal to the multi-phase clock signal line HML. The multiphase clock signal line HML is arranged so as to extend a column portion formed by the A/D conversion circuit 6 positioned corresponding to each column of the pixel portion 3, and is connected to each A/D conversion circuit 6. In each A/D conversion circuit 6, the multiphase clock signal propagating through the multiphase clock signal line HML is used as the lower bit counter signal described in first embodiment.

The high-speed counter circuit 5_1 is composed of a CML (Current Mode Logic) circuit using, for example, a CMOS transistor. The multiphase clock signal is composed of a plurality of clock signals having the same frequency and different phases. Since the number of clock signals constituting the multiphase clock signal is relatively few, the adjustment of the skew in the column section is also easy.

The low-speed digital circuit 5_2 is configured by a digital circuit that operates based on the multiphase clock signal, for example, a binary counter or the like. The low-speed signal formed by the low-speed digital circuit 5_2 is supplied to the low-speed signal line LCL arranged in the column portion. Each A/D conversion circuit 6 positioned to the columns use the low-speed signal propagating through the low-speed signal line LCL as the upper bit counter signal described in first embodiment. The upper bit counter signal is a periodically changing signal, but the frequency thereof is lower than the frequency of the polyphase clock signal constituting the lower bit counter signal, so that it is not necessary to finely adjust the skew in the column section. Further, since each A/D conversion circuit 6 includes the lower bit latch circuit 11, the determination circuit 12, and the upper bit latch circuit 13 as described in, for example, first embodiment, even if a delay difference occurs between the multi-phase clock signal and the low-speed clock signal or/and between the low-speed clock signal and the low-speed clock signal, the occurrence of a malfunction or the like can be prevented.

Figure 15:
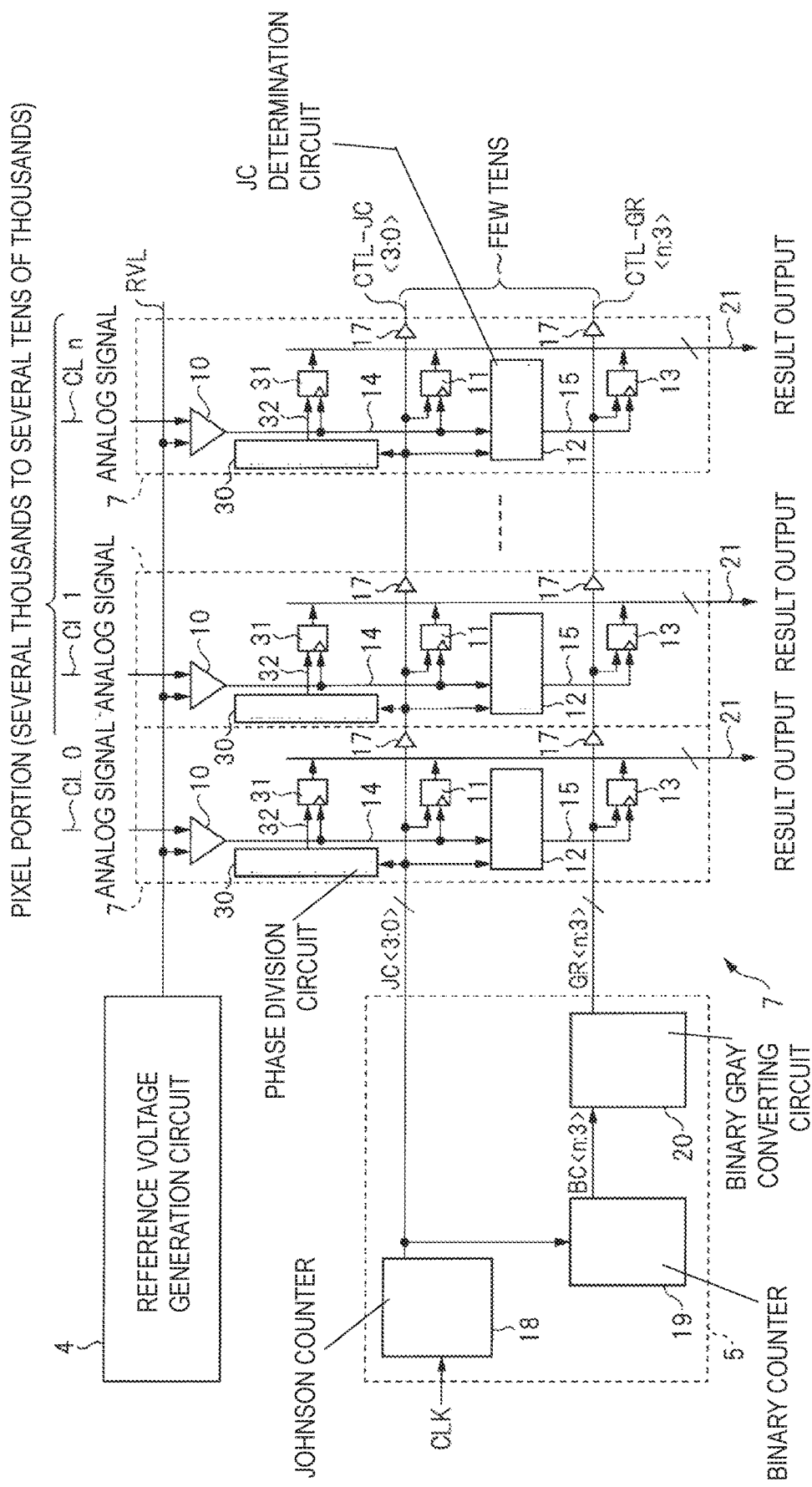
FIG. 15 is a block diagram showing the configuration of the column A/D converter circuit related to fifth embodiment.
Figure 16:
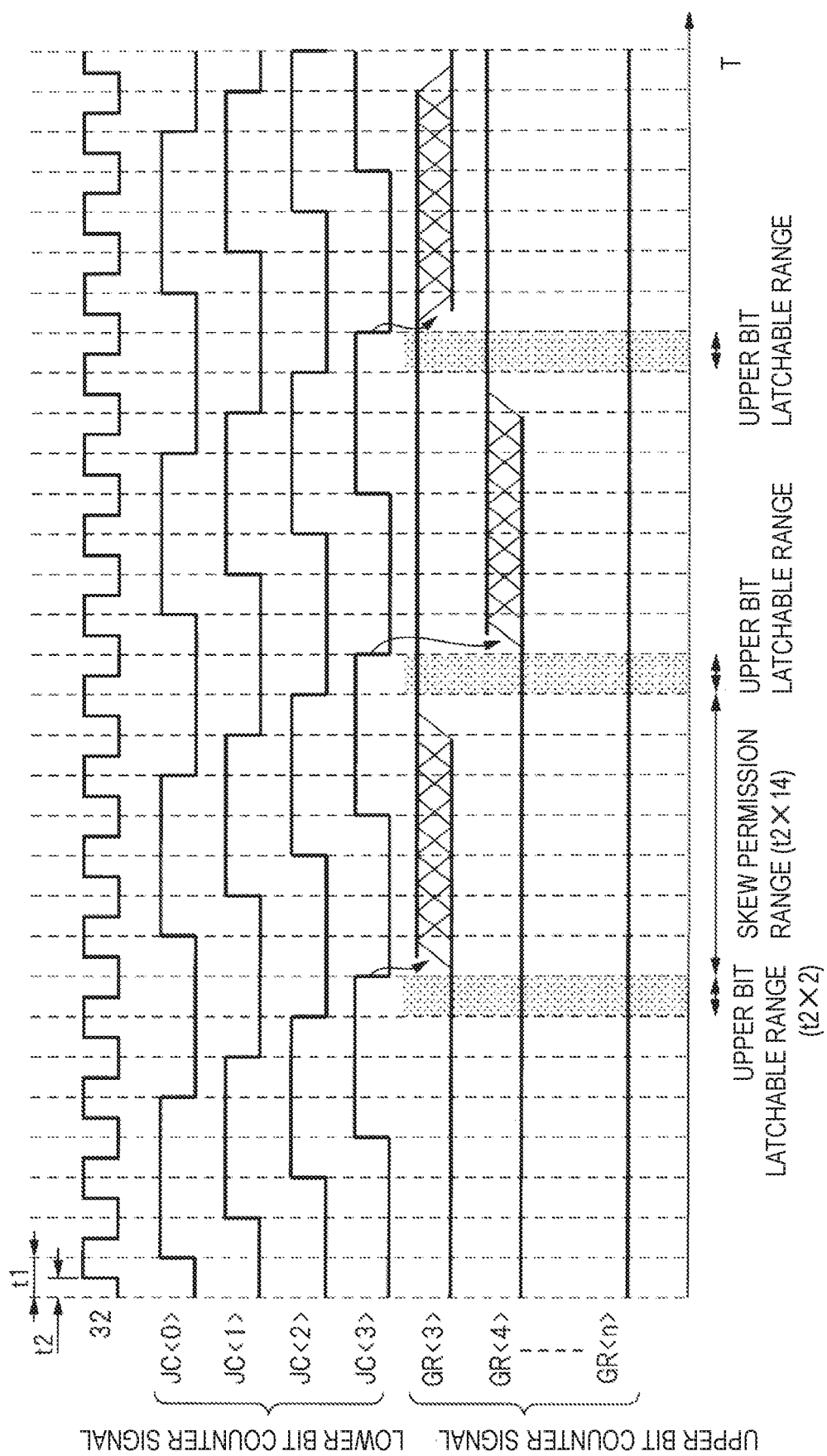
FIG. 16 is a timing diagram showing the operation of the A/D conversion circuit related to the fifth embodiment.

(Fifth embodiment) FIG. 15 is a block diagram showing a configuration of a column A/D conversion circuit related to fifth embodiment. Since FIG. 15 is similar to FIG. 2, the main differences will be explained. In FIG. 15, the main difference is that a phase division circuit 30 and a least significant bit latch circuit 31 are added to each A/D conversion circuit 6 shown in FIG. 2. FIG. 16 is a timing chart showing the operation of the A/D conversion circuit related to the fifth embodiment.

The phase dividing circuit 30 receives the lower bit counter signal JC<3:0>, and generates a signal obtained by dividing the phase of the lower bit counter signal as a phase dividing signal (divided bit counter signal) 32. The phase dividing circuit 30 divides the phase of the lower bit counter signal JC<3:0>, which is a multi-phase clock signal, into two by using, for example, an SMD (Synchronous Mirror Delay) circuit or the like. For example, the phase division circuit 30 bisects the phase difference between the lower bit counter signals JC<3> and JC<0>, raises the voltage of the phase division signal 32 at a timing obtained by bisecting the phase difference, and falls the voltage of the phase division signal 32 at a timing obtained by bisecting the phase difference between the lower bit counter signals JC<0> and JC<1>. As shown in FIG. 16, the phase division circuit 30 repeats such an operation to generate the phase division signal 32 whose voltage changes at a timing shifted by a time t2 which is half the time t1 from the change of the lower bit counter signal JC<3:0> with one cycle being time t1×2.

The phase division signal 32 is not suitable for long distance transmission because it is faster than the lower bit counter signal JC<3:0>. Therefore, in the fifth embodiment, each A/D converting circuit 6 includes the phase dividing circuits 30. Although providing the phase dividing circuit 30 for each A/D conversion circuit 6 increases the area and power consumption, it is desirable to provide one common phase dividing circuit 30 for one to several hundreds of A/D conversion circuits 6.

The least significant bit latch circuit 31 is supplied with the lower bit latch signal 14 and the phase division signal 32 from the phase division circuit 30. The least significant bit latch circuit 31 latches the supplied phase division signal 32 in response to the change of the lower bit latch signal 14 to the low level, and outputs it to the output line 21.

When the lower bit latch signal 14 changes to the wax level, then the lower bit counter signal JC<3:0> and then the phase division signal 32 are provided to the output line 21. As a result, the time corresponding to the minimum input voltage (minimum change) LSB convertible by the A/D conversion circuit 6 becomes a time t2 half of the time t1. In this case, as shown in FIG. 16, the skew permission range is time t2×14, and the upper bit latchable range is time t2×2.

According to the fifth embodiment, the minimum input voltage that can be converted into a digital signal by the A/D converter 6 can be halved as compared with the minimum input voltage of the first embodiment, and the resolution can be improved. In addition, the speed can be increased as compared with first embodiment.

For example, in first embodiment, the upper bit counter signal is GR<n:3>, and the lower bit counter signal is JC<3:0>. Thus, for example, as shown in FIG. 7, seven counter signals are required to represent counter values from 0 to 32. When the same count value is represented by a Gray code, it can be represented by six counter signals as shown in FIG. 23, and the number of counter signals can be reduced. However, by dividing into the upper bit counter signal and the lower bit counter signal, as described in the embodiment, it is possible to provide a skew allowable range that allows the upper bit counter signal to fluctuate due to skew, and it is possible to prevent the characteristics of the A/D conversion circuit from deteriorating.

Although the lower bit latch circuit 11 and the least significant bit latch circuit 31 are shown separately in FIG. 15, the least significant bit latch circuit 31 may be integrated with the lower bit latch circuit 11 to form a single lower bit latch circuit.

In FIG. 2, the Johnson counter 18 can be considered as a lower counter circuit that transmits a lower bit counter signal. In this case, it can be considered that the binary counter 29 and the binary gray conversion circuit 20 constitute an upper counter circuit for transmitting an upper bit counter signal. Further, it can be considered that the column conversion unit is configured by the plurality of A/D conversion circuits and the counter signal lines for transmitting the upper bit counter signal and the lower bit counter signal.

According to the embodiments 1 to 5, by adjusting the delay times for few number of lower bit counter signals, the characteristics of the A/D conversion circuit can be prevented from deteriorating due to skew, and the A/D conversion circuit can be operated at high speed. As a result, it is possible to increase the frame rate, the image quality, and the number of pixels of the image sensor. Further, by using the Johnson counter as the counter circuit for generating the lower bit counter signal, it is possible to generate the lower bit counter signal with little variation in the delay time while reducing the adjustment of the delay time, and it is possible to provide an A/D conversion circuit which can easily perform a high-speed operation.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
   a lower counter circuit configured to output a lower bit counter signal;
   an input signal determination circuit configured to compare a reference voltage with an input signal and output a lower bit latch signal;
   a lower bit latch circuit configured to receive the lower bit counter signal and the lower bit latch signal to output a lower bit latch result signal;
   a lower bit determination circuit configured to receive the lower bit counter signal and the lower bit latch signal to output an upper bit latch signal;
   an upper counter circuit configured to output an upper bit counter signal; and
   an upper bit latch circuit configured to receive the upper bit counter signal and the upper bit latch signal to output an upper bit latch result signal;
   wherein each of the lower bit counter signal and the upper bit counter signal includes a plurality of bit counter signals,
   wherein the lower bit latch circuit latches the lower bit counter signal in response to the lower bit latch signal, and
   wherein the lower bit determination circuit outputs the upper bit latch signal in a period excluding an indefinite period in which the upper bit counter signal becomes indefinite, based on the lower bit latch signal and a predetermined bit counter signal in the lower bit counter signal.

2. A semiconductor device comprising:
   a reference voltage generation circuit for generating a reference voltage linearly varying with passage of time;
   a counter circuit for generating a lower bit counter signal and an upper bit counter signal each of which has a value varying with the passage of time and each of which includes a plurality of bit counter signals; and
   an integration type A/D converter circuit including
      a comparator circuit for comparing an input signal with the reference voltage and outputting a lower bit latch signal when the input signal and the reference voltage reach a predetermined relationship,
      a lower bit latch circuit for latching the lower bit counter signal in response to the lower bit latch signal,
      a determination circuit for outputting an upper bit latch signal in a period excluding an indefinite period in which the upper bit counter signal becomes indefinite based on the lower bit latch signal and a predetermined bit counter signal in the lower bit counter signal, and
      an upper bit latch circuit for latching the upper bit counter signal in response to the upper bit latch signal, wherein the upper bit counter signal latched in the upper bit latch circuit and the lower bit counter signal latched in the lower bit latch circuit are outputted as a digital signal corresponding to the input signal.

3. The semiconductor device as claimed in claim 2, wherein the lower bit counter signal includes a bit counter signal representing a smallest variation of an analogue signal to be converted by the integration type A/D converter circuit.

4. The semiconductor device as claimed in claim 3, wherein the integration type A/D converter circuit includes a decoder circuit for decoding the upper bit counter signal latched in the upper bit latch circuit and the lower bit counter signal latched in the lower bit latch circuit as one digital signal.

5. The semiconductor device as claimed in claim 4,
wherein the determination circuit is supplied with a plurality of bit counter signals in the lower bit counter signal as a predetermined bit counter signal.

6. The semiconductor device as claimed in claim 4,
wherein the counter circuit includes:
- a lower bit counter circuit outputting the lower bit counter signal; and
- an upper bit counter circuit outputting the upper bit counter signal based on a bit counter signal outputted from the lower bit counter circuit.

7. A semiconductor device as claimed in claim 6,
wherein the lower bit counter circuit comprises a Johnson counter for outputting a plurality of signals having phases different from each other as the lower bit counter signal, and
the upper bit counter circuit includes a counter circuit for counting a predetermined signal among a plurality of signals outputted from the Johnson counter and outputting a gray-coded signal as the upper bit counter signal.

8. The semiconductor device as claimed in claim 2,
wherein the counter circuit includes:
- a lower bit counter circuit for outputting the lower bit counter signal;
- an upper bit counter circuit for outputting the upper bit counter signal based on the lower bit counter signal outputted from the lower bit counter circuit; and
- a phase divider circuit for dividing a phase between the bit counter signals outputted from the lower bit counter circuit and outputting a divided bit counter signal representing a smallest variation of an analogue signal to be converted in the integration type A/D converter circuit, and
wherein the lower bit latch circuit latches the lower bit counter signal and the divided bit counter signal in response to the lower bit latch signal.

9. A system comprising:
- a plurality of photosensitive elements arranged in a matrix;
- a pixel portion having a plurality of signal lines arranged along a column of photosensitive elements arranged in a matrix, and coupled with photosensitive elements arranged in each column;
- a reference voltage generation circuit for generating a reference voltage linearly varying with passage of time;
- a counter circuit for outputting an upper bit counter signal and a lower bit counter signal each including a plurality of bit counter signals;
- a plurality of counter signal lines, arranged along row of the photosensitive elements arranged in the matrix, for transmitting the upper bit counter signals and the lower bit counter signals; and
- column converter unit, arranged along each column direction, having a plurality of signal lines arranged in each column and a plurality of integration type A/D converters arranged in each column;

wherein each of the plurality of integration type A/D converters includes a comparator outputs a lower bit latch signal comparing an input signal supplied from a corresponding signal line with the reference voltage,
a lower bit latch circuit latches lower bit counter signal transmitted from a counter signal line in response to the lower bit latch signal,
a determination circuit outputs an upper bit latch signal in a period excluding an indefinite period in which an upper bit latch signal becomes indefinite based on the lower bit latch signal and a predetermined bit counter signal in the lower bit counter signal, and
an upper bit latch circuit latches an upper bit counter signal transmitted from a counter signal line in response to the upper bit latch signal.

10. The system as claimed in claim 9,
wherein the counter circuit includes
- a first counter circuit for outputting the lower bit counter signal,
- a second counter circuit for generating the upper bit counter signal based on a bit counter signal outputted from the first counter circuit at a lower speed than the first counter circuit, and
wherein the system further comprises a decoder circuit for receiving the upper bit counter signal latched in the upper bit latch circuit and the lower bit counter signal latched in the lower bit latch circuit, and
wherein the decoder circuit outputs a digital signal corresponding to an input signal supplied from on photosensitive element through corresponding one signal line.

11. The system as claimed in claim 9,
wherein the column conversion unit includes a phase division circuit arranged in a predetermined column, coupled to a counter signal line for transmitting the lower bit counter signal, for generating a divided bit counter signal dividing a phase difference between the lower bit counter signals, and
wherein the lower bit latch circuit latches the lower bit counter signal and the lower bit latch circuit latches the lower bit counter signal and the divided bit counter signal in response to the lower bit latch signal.

* * * * *